US012610689B2

(12) United States Patent (10) Patent No.: US 12,610,689 B2
Kim (45) Date of Patent: Apr. 21, 2026

(54) DISPLAY DEVICE

(71) Applicant: Samsung Display Co., Ltd., Yongin-Si (KR)

(72) Inventor: Keun Woo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 17/483,846

(22) Filed: Sep. 24, 2021

(65) Prior Publication Data

US 2022/0271112 A1 Aug. 25, 2022

(30) Foreign Application Priority Data

Feb. 23, 2021 (KR) ........................ 10-2021-0023889

(51) Int. Cl.
H10K 59/121 (2023.01)
H10D 30/67 (2025.01)
H10K 59/131 (2023.01)

(52) U.S. Cl.
CPC ..... H10K 59/1213 (2023.02); H10D 30/6713 (2025.01); H10D 30/6755 (2025.01); H10D 30/6757 (2025.01); H10K 59/131 (2023.02)

(58) Field of Classification Search
CPC .............. H10K 59/1213; H10K 59/131; H01L 29/78618; H01L 29/7869; H01L 29/78696
USPC ........................................................ 257/40
See application file for complete search history.

(56) References Cited

U.S. PATENT DOCUMENTS

| | | | |
|---|---|---|---|
| 9,853,063 B2 | 12/2017 | Abe et al. | |
| 10,192,895 B2* | 1/2019 | Abe ...................... | H01L 27/124 |
| 10,482,817 B2 | 11/2019 | Kim et al. | |
| 2015/0206931 A1 | 7/2015 | Choi et al. | |
| 2015/0277172 A1* | 10/2015 | Sekine ................ | G02F 1/13306 |
| | | | 349/43 |
| 2018/0122835 A1* | 5/2018 | Watakabe ............ | H10K 59/124 |
| 2020/0264484 A1* | 8/2020 | Jinnai ................... | H01L 27/124 |

FOREIGN PATENT DOCUMENTS

| | | |
|---|---|---|
| CN | 108154846 A | 6/2018 |
| JP | 2017-38000 A | 2/2017 |
| JP | 2020134674 A | 8/2020 |
| KR | 101991338 B1 | 6/2019 |

* cited by examiner

*Primary Examiner* — Ori Nadav
(74) *Attorney, Agent, or Firm* — Innovation Counsel LLP

(57) ABSTRACT

A display device is provided. The display device includes substrate, a lower conductive layer disposed on the substrate, and including a first lower conductive pattern and a second lower conductive pattern electrically isolated from each other, a first semiconductor layer including a first channel region, and a first source disposed on one side of the first channel region and a first drain region disposed on the other side of the first channel region. The first lower conductive pattern overlaps the first channel region and the first source region, and the second lower conductive pattern overlaps the first channel region and the first drain region in a plan view, and different voltages are applied to the first lower conductive pattern and the second lower conductive pattern.

16 Claims, 13 Drawing Sheets

BML: BML1, BML2
100: 101a, 101b, 101c, 105a, 105b, 105c
110: 111, 115
120: 121, 122

BML_2: BML1_2, BML2_2
100: 101a, 101b, 101c, 105a, 105b, 105c
110: 111, 115
120: 121, 122

Figure 13:
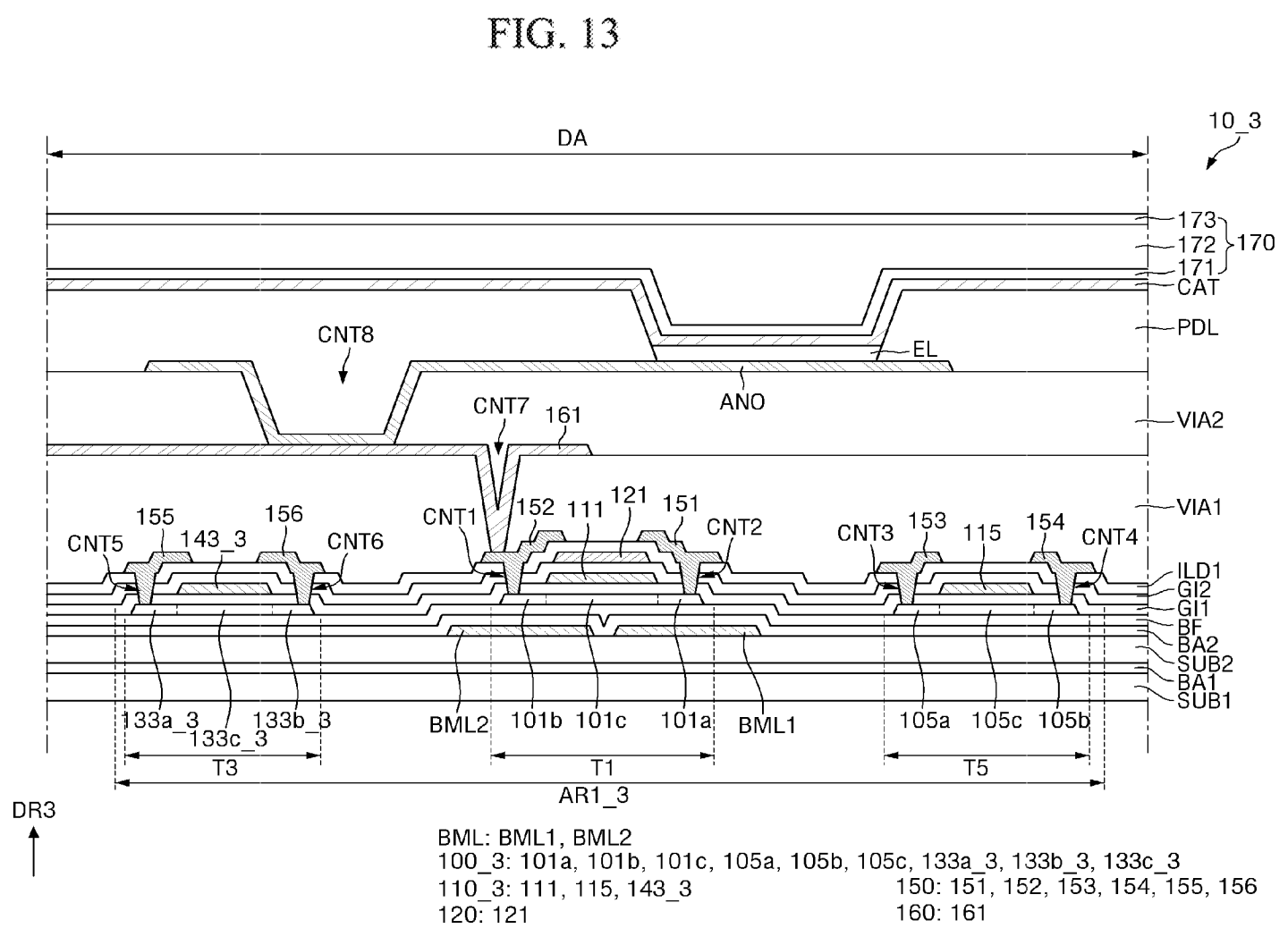

BML: BML1, BML2
100_3: 101a, 101b, 101c, 105a, 105b, 105c, 133a_3, 133b_3, 133c_3
110_3: 111, 115, 143_3
120: 121
150: 151, 152, 153, 154, 155, 156
160: 161

DISPLAY DEVICE

CROSS-REFERENCE TO RELATED APPLICATION

This application claims priority to Korean Patent Application No. 10-2021-0023889 filed on Feb. 23, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The importance of display devices has steadily increased with the development of multimedia technology. Accordingly, various types of display devices such as a liquid crystal display (LCD) device, an organic light emitting display (OLED) device and the like have been used. Among the display devices, the organic light emitting display device displays an image using an organic light emitting element that generates light by recombination of electrons and holes. The organic light emitting display device includes a plurality of transistors that provide a driving current to the organic light emitting element.

Each of the plurality of transistors may include an active layer and the active layers of the plurality of transistors may be made of different materials from each other.

SUMMARY

Aspects of the present disclosure provide a display device capable of improving step efficiency while improving defects such as stains or afterimages.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a substrate, a lower conductive layer disposed on the substrate, and including a first lower conductive pattern and a second lower conductive pattern electrically isolated from each other, a buffer layer disposed on the lower conductive layer, a first semiconductor layer disposed on the buffer layer, and including a first channel region of a first transistor, and a first source region of the first transistor disposed on one side of the first channel region of the first transistor and a first drain region of the first transistor disposed on the other side of the first channel region of the first transistor, a first insulating layer disposed on the first semiconductor layer, and a first gate electrode of the first transistor disposed on the first insulating layer, wherein the first lower conductive pattern overlaps the first channel region of the first transistor and the first source region of the first transistor, and the second lower conductive pattern overlaps the first channel region of the first transistor and the first drain region of the first transistor in a plan view, and different voltages are applied to the first lower conductive pattern and the second lower conductive pattern.

An embodiment of a display device includes a first power voltage line, a light emitting element, a first transistor including a first channel region, a first source region disposed on one side of the channel region and electrically connected to the first power voltage line, and a first drain region disposed on the other side of the channel region and electrically connected to the light emitting element, a second transistor connected between the first drain region of the first transistor and a first gate electrode of the first transistor, and a lower conductive layer disposed below the first transistor, and including a first lower conductive pattern overlapping the first channel region of the first transistor and the first source region of the first transistor, and a second lower conductive pattern overlapping the first channel region of the first transistor and the first source region of the first transistor, wherein the first lower conductive pattern and the second lower conductive pattern are electrically isolated from each other, and different voltages are applied to the first lower conductive pattern and the second lower conductive pattern, respectively.

In accordance with the display device according to one embodiment, the step efficiency may be improved while improving defects such as stains or afterimages.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which:

FIG. 11 is a cross-sectional view of a display panel according to still another embodiment;

FIG. 13 is a cross-sectional view illustrating a cross section of a one pixel according to still another embodiment.

DETAILED DESCRIPTION OF THE EMBODIMENTS

The present inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments will be described in detail with reference to the accompanying drawings.

Figure 1:
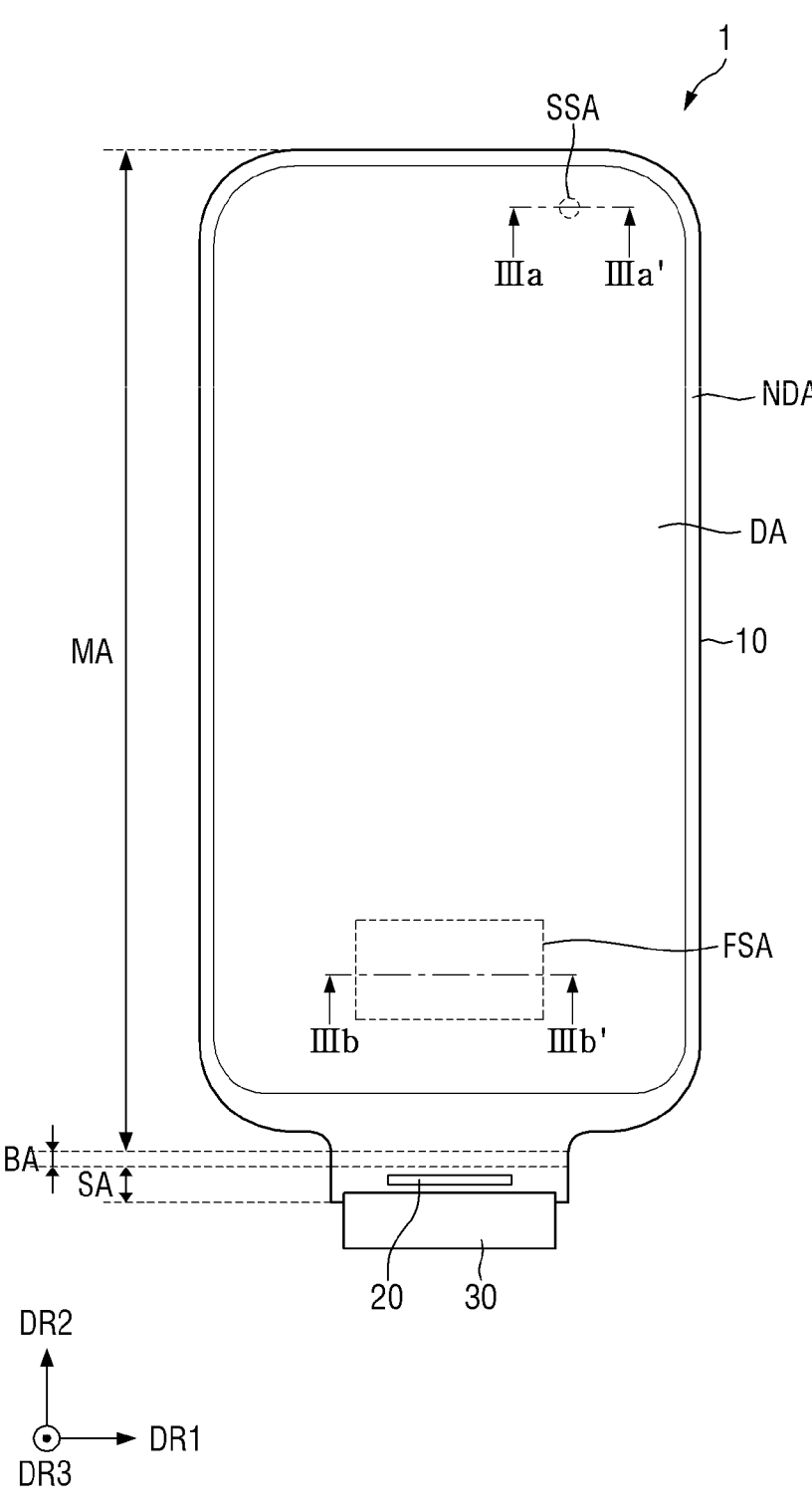
FIG. 1 is a plan view of a display device according to one embodiment.
Figure 2:
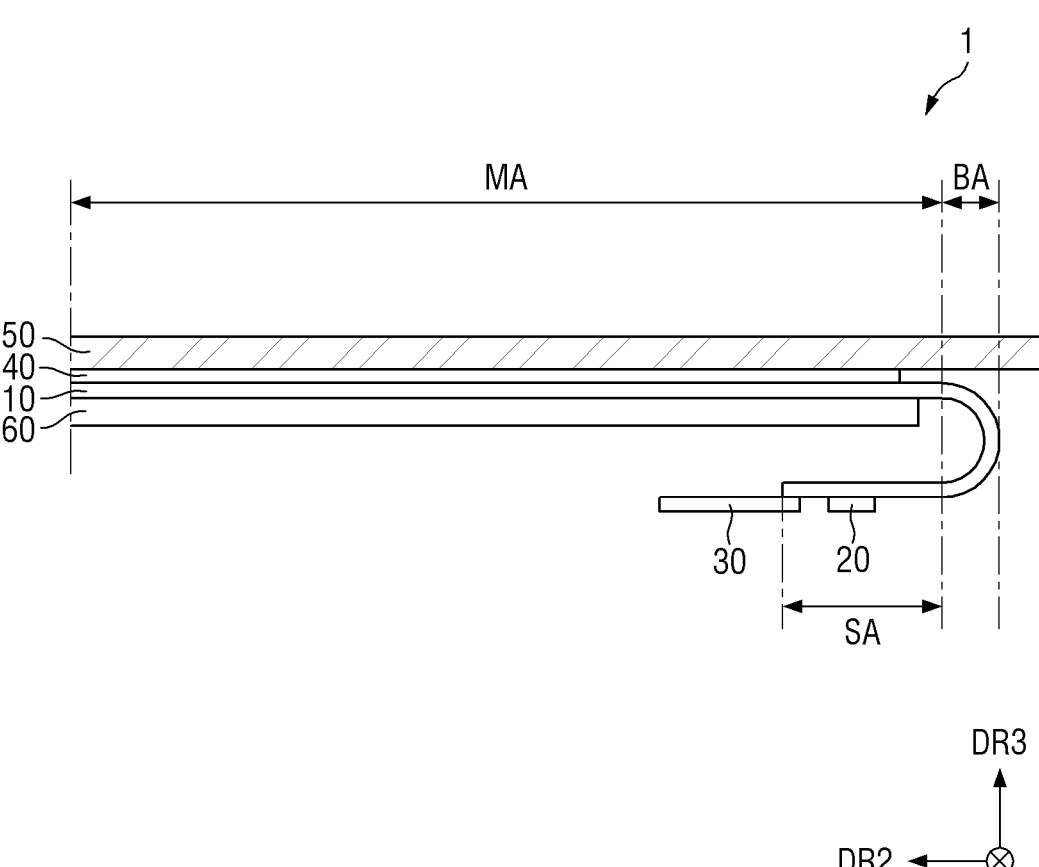
FIG. 2 is a side view of the display device of FIG. 1 in a bent state, and shows a side elevation of the display device bent in a thickness direction.

FIG. 1 is a plan view of a display device according to one embodiment. FIG. 2 is a side view of the display device of FIG. 1 in a bent state. FIG. 2 shows a side view of the display device bent in a thickness direction.

A display device 1 is a device for displaying a moving image or a still image. The display device 1 may be used as a display screen of various products such as televisions, laptop computers, monitors, billboards, and Internet-of-Things devices as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 according to one embodiment may have a substantially rectangular shape in a plan view. The display device 1 may have a rectangular shape with right-angled corners in a plan view. However, without being limited thereto, the display device 1 may have a rectangular shape with rounded corners in a plan view.

In the drawings, a first direction DR1 indicates a horizontal direction of the display device 1 in a plan view, and a second direction DR2 indicates a vertical direction of the display device 1 in a plan view. Further, a third direction DR3 indicates a thickness direction of the display device 1. The first direction DR1 and the second direction DR2 perpendicularly intersect each other. The third direction DR3 is a direction intersecting the plane on which the first direction DR1 and the second direction DR2 are located, and perpendicularly intersects both the first direction DR1 and the second direction DR2. It should be understood, however, that a direction mentioned in the embodiment refers to a relative direction and the embodiment is not limited to the direction mentioned.

Unless otherwise defined, with respect to the third direction DR3, the terms "above," "top surface," and "upper side" as used herein refer to a display surface's side of a display panel 10, and the terms "below," "bottom surface," and "lower side" as used herein refer to a side opposite to the display surface of the display panel 10.

Referring to FIGS. 1 and 2, the display device 1 may include a display panel 10. The display panel 10 may be a flexible substrate including a flexible polymer material such as polyimide or the like. Accordingly, the display panel 10 can be curved, bent, folded or rolled.

The display panel 10 may be an organic light emitting display panel. In the following embodiments, a case where the organic light emitting display panel is used as the display panel 10 will be described as an example, but the present disclosure is not limited thereto, and other types of display panels such as a liquid crystal display (LCD) panel, a quantum dot organic light emitting display (QD-OLED) panel, a quantum dot liquid crystal display (QD-LCD) panel, a quantum dot nano light emitting display (QNED) panel and a micro LED panel may be used as the display panel 10.

The display panel 10 may include a display area DA displaying images and a non-display area NDA where no image display is performed. The display panel 10 may include the display area DA and the non-display area NDA in a plan view. The non-display area NDA may be disposed to surround the display area DA. The non-display area NDA may form a bezel.

The display area DA may have a rectangular shape with right-angled or rounded corners in a plan view. The display area DA may have short and long sides. The short side of the display area DA may be a side extending in the first direction DR1. The long side of the display area DA may be a side extending in the second direction DR2. However, the planar shape of the display area DA is not limited to a rectangular shape, but may have a circular shape, an elliptical shape, or various other shapes.

The display area DA may include a plurality of pixels. The pixels may be arranged in a matrix. Each pixel may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation layer. A detailed configuration of the pixel will be described later.

The non-display area NDA may be disposed adjacent to both the short sides and the long sides of the display area DA. In this case, the non-display area NDA may surround all sides of the display area DA and form edges of the display area DA. However, the present disclosure is not limited thereto, and the non-display area NDA may be disposed adjacent to either short sides or long sides of the display area DA.

The display device 1 may further include a sensor area SSA and a fingerprint sensing area FSA. The sensor area SSA may sense at least one of illuminance, infrared ray or ultrasonic wave, or may recognize a user's iris. The fingerprint sensing area FSA may sense the user's fingerprint. The sensor area SSA and the fingerprint sensing area FSA may be disposed in the display area DA. The pixels may be disposed in the sensor area SSA and the fingerprint sensing area FSA to display images. However, the present disclosure is not limited thereto, and at least one of the sensor area SSA or the fingerprint sensing area FSA may be disposed in the non-display area NDA or may not display images although disposed in the display area DA. The fingerprint sensing area FSA may be located in a part of the display area DA, but the present disclosure is not limited thereto. For example, the fingerprint sensing area FSA may be substantially the same as the display area DA and may overlap the entire area of the display area DA.

The display panel 10 may include a main region MA and a bending region BA connected to one side of the main region MA in the second direction DR2. The display panel 10 may further include a sub-region SA which is connected to one end of the bending region BA along the second direction DR2 and bent in a thickness direction to overlap the main region MA in the thickness direction.

The display area DA may be located in the main region MA. The non-display area NDA may be located in the peripheral edge portion of the display area DA of the main region MA.

The main region MA may have a shape similar to an external appearance of the display device 1 in a plan view. The main region MA may be a flat region located on one plane. However, the present disclosure is not limited thereto, and at least one edge of the remaining edges except an edge (side) of the main region MA connected to the bending region BA may be bent in a curved shape or bent in a vertical direction.

If at least one of the edges other than the edge (side) of the main region MA connected to the bending region BA is curved or bent, the display area DA may also be disposed on the corresponding edge. However, the present disclosure is not limited thereto, the non-display area NDA that does not display images may be disposed on the curved or bent edge. Alternatively, both the display area DA and the non-display area NDA may be disposed on the curved or bent edge.

The non-display area NDA of the main region MA may be placed in a region between the outer boundary of the display area DA and the edge of the display panel 10. Signal wires or driving circuits may be disposed in the non-display area NDA of the main region MA to apply a signal to the display area DA.

The bending region BA may be connected to one short side of the main region MA. The width (width in the first direction DR1) of the bending region BA may be smaller than the width (width of the short side) of the main region MA. A connection portion between the main region MA and the bending region BA may have an L-shaped cut portion to reduce the width of the bezel.

In the bending region BA, the display panel 10 may be bent with a curvature in a direction opposite to the display surface. The surface of the display panel 10 of the sub-region SA may face a direction opposite to a direction the main region MA faces.

The sub-region SA extends from the bending region BA. The sub-region SA may extend in a direction parallel to the main region MA from a point where the bending region BA ends. The sub-region SA may overlap the main region MA in the thickness direction of the display panel 10. The sub-region SA may overlap the non-display area NDA of the main region MA disposed in the edge of the main region MA and further overlap the display area DA of the main region MA. The width of the sub-region SA may be the same as the width of the bending region BA, but is not limited thereto.

A pad portion may be disposed on the sub-region SA of the display panel 10. An external device may be mounted on (or attached to) the pad portion. The examples of the external device may include a driving chip 20 and a driving board 30 formed of a flexible or rigid printed circuit board, and a wiring connection film, a connector, or the like may also be mounted on the pad portion as an external device. It may be possible for one or more external devices to be mounted on the sub-region SA. For example, as shown in FIGS. 1 and 2, the driving chip 20 may be arranged on the sub-region SA of the display panel 10, and the driving board 30 may be attached to one end of the sub-region SA. In this case, the display panel 10 may include a pad portion connected to the driving chip 20 and another pad portion connected to the driving board 30. In another embodiment, the driving chip 200 may be mounted on a film which is attached to the sub-region SA of the display panel 10.

The driving chip 20, which is mounted on one surface of the display panel 10 which is the same surface as the display surface, may be mounted on the surface of the display panel 10 facing downward in the thickness direction as the bending region BA is bent and reversed as described above such that the top surface of the driving chip 20 faces downward.

The driving chip 20 may be attached onto the display panel 10 through an anisotropic conductive film or through ultrasonic bonding. The width of the driving chip 20 in the horizontal direction may be smaller than that of the display panel 10 in the horizontal direction. The driving chip 20 may be disposed in a central portion of the sub-region SA in the horizontal direction (the first direction DR1). The left edge and the right edge of the driving chip 20 may be disposed to be spaced apart from the left edge and the right edge of the sub-region SA, respectively.

The driving chip 20 may include an integrated circuit for driving the display panel 10. In one embodiment, the integrated circuit may be, but is not limited to, a data driving integrated circuit that generates and provides a data signal. The driving chip 20 is connected to a wire pad disposed on the pad portion of the display panel 10 to provide the data signal to the wire pad. Wires connected to the wire pad extend toward the pixel and apply the data signal or the like to each pixel.

The display device 1 may further include an anti-reflection layer 40 disposed above the display panel 10, a cover window 50 disposed on the anti-reflection layer 40 and a lower cover layer 60 disposed below the display panel 10.

The anti-reflection layer 40 may serve to reduce the reflection of external light. The anti-reflection layer 40 may be provided in the form of a polarizing film. In this case, the anti-reflection layer 40 polarizes light passing therethrough. The present disclosure is not limited thereto, and the anti-reflection layer 40 may be provided as a color filter layer in the display panel 10.

The cover window 50 serves to cover and protect the display panel 10. The cover window 50 may be made of a transparent material. The cover window 50 may include, for example, glass or plastic. When the cover window 50 includes glass, the glass may be ultra-thin glass (UTG) or thin glass. When the cover window 50 includes plastic, the plastic may be transparent polyimide or the like, but is not limited thereto. The cover window 50 may have a flexible property such that it can be twisted, bent, folded, or rolled.

At least a part of the cover window 50 may be disposed to cover the display panel 10. In other words, the cover window 50 may cover the entire area of the display panel 10 to protect the outside of the display panel 10, but is not limited thereto.

The lower cover layer 60 may serve to cover and protect the display panel 10 from below the display panel 10. For example, the lower cover layer 60 serves to diffuse heat generated from the display panel 10 or other parts of the display device 1. In this case, the lower cover layer 60 may include a metal plate. The metal plate may include metal having excellent thermal conductivity, such as copper and silver. The lower cover layer 60 may include a heat dissipation sheet including graphite, carbon nanotubes or the like.

However, the present disclosure is not limited thereto, the lower cover layer 60 may serve to alleviate the impact that may be applied to the display device 1 from below the display panel 10, or may include a light absorbing material to suppress light incident on the display device 1 from the outside. When performing various functions, the lower cover layer 60 may include a plurality of stacked structures, each performing its function.

The lower cover layer 60 may expose the display panel 10 in at least a partial area. In other words, the lower cover layer 60 may be physically removed in at least a partial area along the thickness direction (third direction DR3), and the display panel 10 may be exposed in the area in which the lower cover layer 60 has been removed. For example, the lower cover layer 60 may be physically removed from the sensor area SSA and the fingerprint sensing area FSA to provide a space in which a separate component may be disposed.

Figure 3:
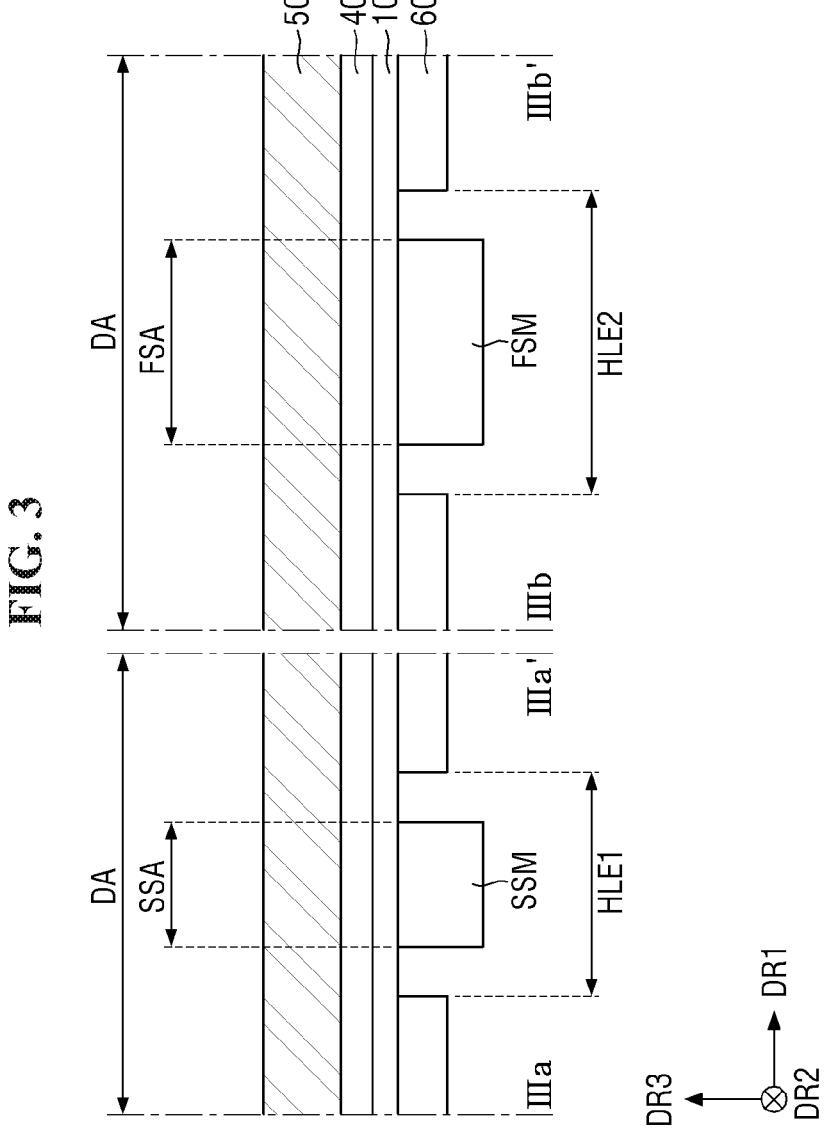
FIG. 3 is a cross-sectional view taken along lines IIIa-IIIa' and IIIb-IIIb' of FIG. 1.

FIG. 3 is a cross-sectional view taken along lines IIIa-IIIa' and IIIb-IIIb' of FIG. 1.

Referring to FIG. 3, the display device 1 may further include a sensor module SSM and a fingerprint sensing module FSM. For example, the sensor module SSM may include at least one of an illuminance sensor, a proximity sensor, an infrared sensor, an ultrasonic sensor, or an iris recognition sensor. The fingerprint sensing module FSM may include a fingerprint sensor capable of sensing a fingerprint.

The lower cover layer 60 may include a first through hole HLE1 and a second through hole HLE2. The first through hole HLE1 and the second through hole HLE2 may be formed through the lower cover layer 60 in the thickness direction (third direction DR3). The first through hole HLE1 may overlap the sensor area SSA and the sensor module SSM may be disposed in the first through hole HLE1. The second through hole HLE2 may overlap the fingerprint sensing area FSA and the fingerprint sensing module FSM may be disposed in the second through hole HLE2.

Figure 4:
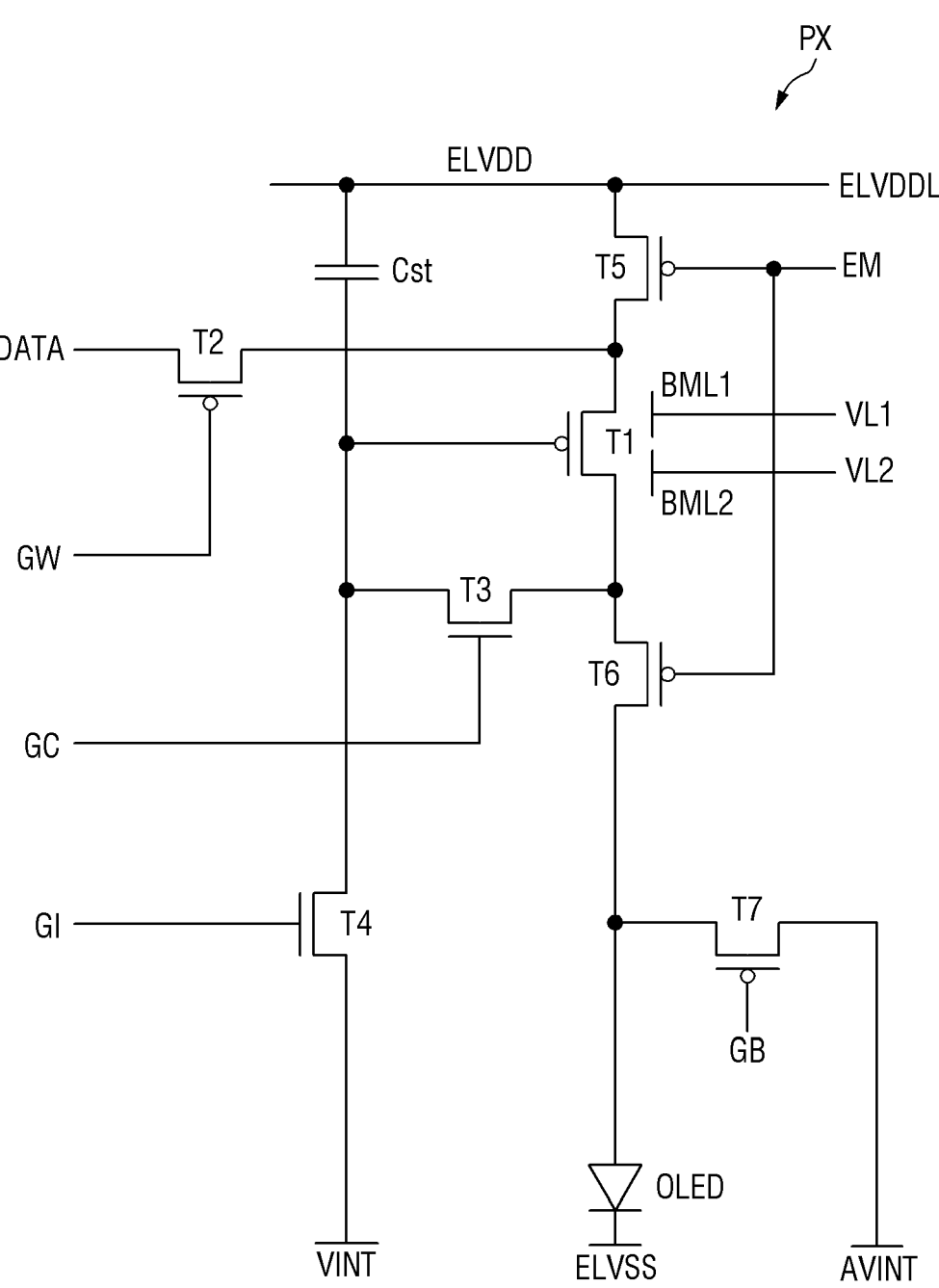
FIG. 4 is an equivalent circuit diagram of one pixel of a display device according to one embodiment.

FIG. 4 is an equivalent circuit diagram of one pixel of a display device according to one embodiment.

Referring to FIG. 4, a circuit of one pixel PX of the display device includes an organic light emitting diode OLED, a plurality of transistors T1 to T7 and a storage capacitor Cst. In the circuit of one pixel, a data signal DATA, a first scan signal GW, a second scan signal GC, a third scan signal GI, a fourth scan signal GB, an emission control signal EM, a first power voltage ELVDD, a second power voltage ELVSS, a first initialization voltage VINT and a second initialization voltage AVINT are applied.

The fourth scan signal GB may be substantially the same scan signal as the first scan signal (not shown) of the adjacent pixel. In other words, the number of scan lines which is connected to one pixel may be four, but the scan line transmitting a fourth scan signal among the four scan lines may be connected to the scan line transmitting a first scan signal in the adjacent pixel, so that they transmit the same scan signal. That is, the number of scan signals included in each pixel PX may substantially be three as described above.

The organic light emitting diode OLED includes an anode electrode (or first electrode) and a cathode electrode (or second electrode). The storage capacitor Cst includes a first electrode and a second electrode.

The plurality of transistors may include first to seventh transistors T1 to T7. Each of the transistors T1 to T7 includes a gate electrode, a first electrode (or first source/drain electrode) and a second electrode (or second source/drain electrode). One of the first and second electrodes of each of the transistors T1 to T7 is a source electrode and the other of the first and second electrodes of each of the transistors T1 to T7 is a drain electrode.

Each of the transistors T1 to T7 may be a thin film transistor. The transistors T1 to T7 may each be one of a PMOS transistor and a NMOS transistor. In one embodiment, the first transistor T1 as a driving transistor, the second transistor T2 as a data transfer transistor, the fifth transistor T5 as a first light emitting control transistor, the sixth transistor T6 as a second light emitting control transistor, and the seventh transistor T7 as a second initialization transistor may each be a PMOS transistor. On the other hand, the third transistor T3 which is a compensation transistor and the fourth transistor T4 which is a first initialization transistor are NMOS transistors. The PMOS transistor and the NMOS transistor differ in characteristics, and the third transistor T3 and the fourth transistor T4 may each be formed as an NMOS transistor having relatively superior turn-off characteristics which may reduce leakage of a driving current during the light emission period of the organic light emitting diode OLED.

Hereinafter, each component will be described in detail.

The gate electrode of the first transistor T1 is connected to the first electrode of the storage capacitor Cst. The first electrode of the first transistor T1 is connected to a first power voltage line ELVDDL for applying the first power voltage ELVDD via the fifth transistor T5. The second electrode of the first transistor T1 is connected to the anode electrode of the organic light emitting diode OLED via the sixth transistor T6. The first transistor T1 supplies the driving current to the light emitting diode OLED based on the data signal DATA received according to a switching operation of the second transistor T2.

The gate electrode of the second transistor T2 is connected to the first scan signal GW terminal. The first electrode of the second transistor T2 is connected to the data signal DATA terminal. The second electrode of the second transistor T2 is connected to the first electrode of the first transistor T1 and also connected to the first power voltage ELVDD terminal via the fifth transistor T5. The second transistor T2 is turned on in response to the first scan signal GW and performs a switching operation of transmitting the data signal DATA to the first electrode of the first transistor T1.

The gate electrode of the third transistor T3 is connected to the second scan signal GC terminal. The first electrode of the third transistor T3 is connected to the second electrode of the first transistor T1 and also connected to the anode electrode of the organic light emitting diode OLED via the sixth transistor T6. The second electrode of the third transistor T3 is connected simultaneously to the first electrode of the storage capacitor Cst, the first electrode of the fourth transistor T4, and the gate electrode of the first transistor T1. The third transistor T3 is turned on in response to the second scan signal GW to connect the gate electrode and the second electrode of the first transistor T1, whereby the first transistor T1 forms a diode connection. Accordingly, although when a voltage difference corresponding to a threshold voltage of the first transistor T1 is generated between the gate electrode and the first electrode of the first transistor T1, the data signal DATA in which the threshold voltage is compensated is supplied to the gate electrode of the first transistor T1 through the third transistor T3, thereby compensating for a threshold voltage deviation of the first transistor T1.

The gate electrode of the fourth transistor T4 is connected to the third scan signal GI terminal. The second electrode of the fourth transistor T4 is connected to the initialization voltage VINT terminal. The first electrode of the fourth transistor T4 is connected simultaneously to the first electrode of the storage capacitor Cst, the second electrode of the third transistor T3, and the gate electrode of the first transistor T1. The transistor T4 is turned on in response to the third scan signal GI to transfer the first initialization voltage VINT to the gate electrode of the first transistor T1 to carry out an operation of initializing the voltage of the gate electrode of the first transistor T1.

The gate electrode of the fifth transistor T5 is connected to the emission control signal EM terminal. The first electrode of the fifth transistor T5 is connected to the first power voltage ELVDD terminal. The second electrode of the fifth transistor T5 is connected to the first electrode of the first transistor T1 and the second electrode of the second transistor T2.

The gate electrode of the sixth transistor T6 is connected to the emission control signal EM terminal. The first electrode of the sixth transistor T6 is connected to the second electrode of the first transistor T1 and the first electrode of the third transistor T3. The second electrode of the sixth transistor T6 is connected to the anode electrode of the organic light emitting diode OLED.

The fifth transistor T5 and the sixth transistor T6 are simultaneously turned on in response to the emission control signal EM so that the driving current flows through the organic light emitting diode OLED.

The gate electrode of the seventh transistor T7 is connected to the fourth scan signal GB terminal. The first electrode of the seventh transistor T7 is connected to the second initialization voltage AVINT terminal. The second electrode of the seventh transistor T7 is connected to the anode electrode of the organic light emitting diode OLED. The seventh transistor T7 is turned on in response to the fourth scan signal GB to initialize the anode electrode of the organic light emitting element OLED.

In the present embodiment, the gate electrode of the seventh transistor T7 receives the fourth scan signal GB. However, in another embodiment, a pixel circuit may be configured such that the gate electrode of the seventh transistor T7 receives the first scan signal GW. In addition, in the present embodiment, the first electrode of the seventh transistor T7 is connected to the second initialization voltage AVINT terminal. However, in another embodiment, the first electrode of the seventh transistor T7 may be connected to the first initialization voltage VINT terminal and the second electrode of the fourth transistor T4.

The second electrode of the storage capacitor Cst is connected to the first power voltage ELVDD terminal. The first electrode of the storage capacitor Cst is connected simultaneously to the gate electrode of the first transistor T1, the second electrode of the third transistor T3, and the first electrode of the fourth transistor T4. The cathode electrode of the organic light emitting diode OLED is connected to the second power voltage ELVSS terminal. The organic light emitting diode OLED receives the driving current from the first transistor T1 and emits light to display an image.

The pixel PX may further include a first lower conductive pattern BML1, a second lower conductive pattern BML2, a first voltage line VL1 electrically connected to the first lower conductive pattern BML1, and a second voltage line VL2 electrically connected to the second lower conductive pattern BML2.

Figure 5:
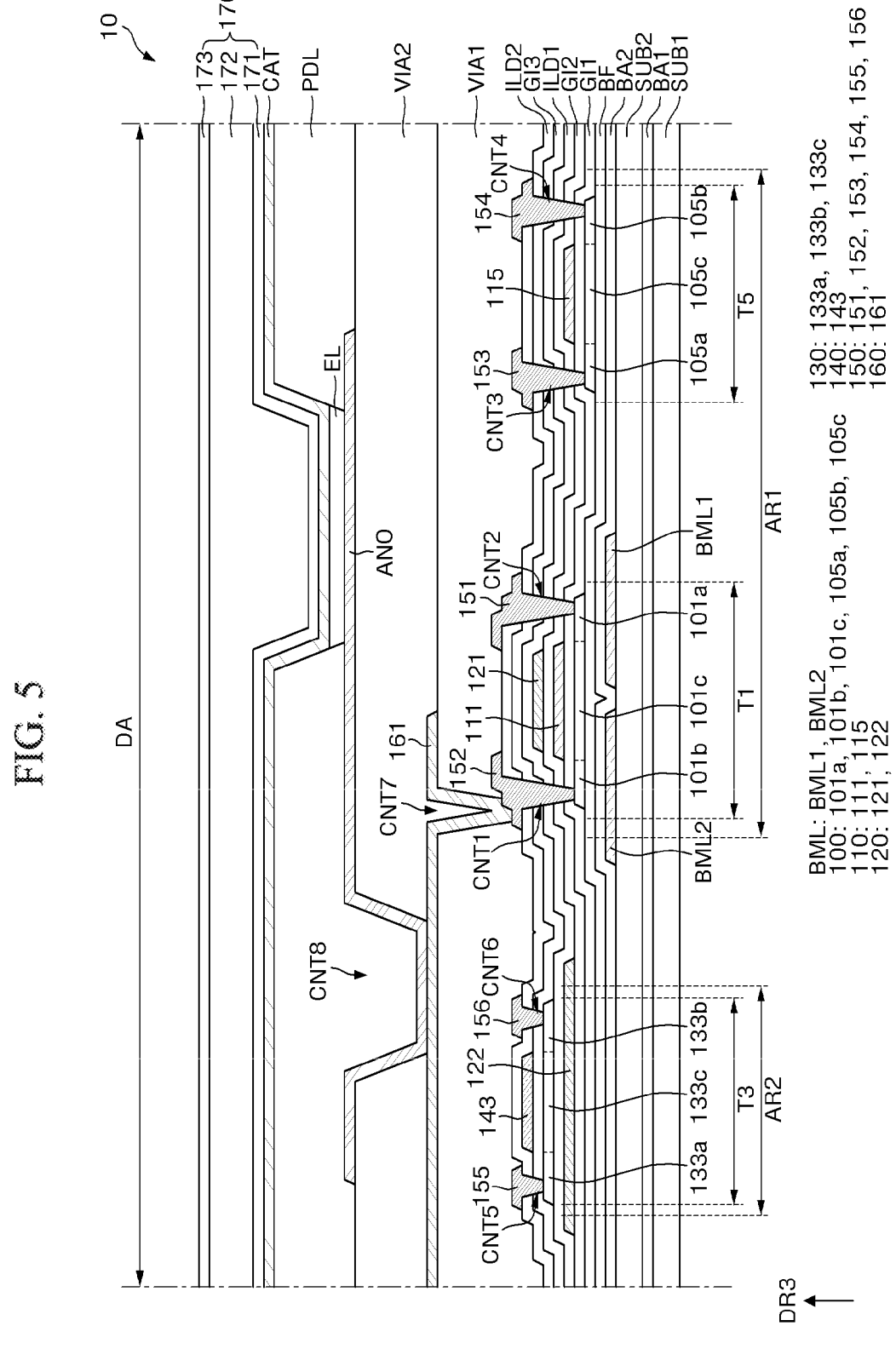
FIG. 5 is a cross-sectional view illustrating a cross section of a pixel according to one embodiment.

FIG. 5 is a cross-sectional view illustrating a cross section of a pixel according to one embodiment.

Referring to FIGS. 4 and 5, the display area DA may include a first region AR1 and a second region AR2. Semiconductor layers including different materials may be disposed in the first region AR1 and the second region AR2, respectively. A first semiconductor layer 100 may be disposed in the first region AR1, and a second semiconductor layer 130 may be disposed in the second region AR2. In addition, a non-oxide inorganic semiconductor transistor (hereinafter, simply referred to as "silicon transistor") including polycrystalline silicon may be disposed as a channel in the first region AR1 and an oxide semiconductor transistor (hereinafter, simply referred to as "oxide transistor") including an oxide semiconductor may be disposed as a channel in the second region AR2. Hereinafter, the first region AR1 will be referred to as a silicon transistor region AR1 and the second region AR2 will be referred to as an oxide transistor region AR2.

The silicon transistor arranged in the silicon transistor region AR1 may be a PMOS transistor and, in FIG. 5, the first transistor T1 as a driving transistor and the fifth transistor T5 as a switching transistor are shown, by way of example, as the silicon transistor. The oxide transistor arranged in the oxide transistor region AR2 may be an NMOS transistor and, in FIG. 5, the third transistor T3 as a compensation transistor is shown, by way of example, as the oxide transistor.

The second transistor T2, the sixth transistor T6 and the seventh transistor T7 are disposed in the silicon transistor region AR1 and are silicon transistors different from one another. The second transistor T2, the sixth transistor T6 and the seventh transistor T7 may have substantially the same stacked structures as the first transistor T1 or the fifth transistor T5. The fourth transistor T4 is disposed in the oxide transistor region AR2 and is another oxide transistor. The fourth transistor T4 may have substantially the same stacked structure as the third transistor T3. The detailed descriptions of the silicon transistor and the oxide transistor are made later.

A first substrate SUB1, a first barrier layer BA1, a second substrate SUB2, a lower conductive layer BML, a second barrier layer BA2, a buffer layer BF, the first semiconductor layer 100, a first gate insulating layer GI1, a first conductive layer 110, a second gate insulating layer GI2, a second conductive layer 120, a first interlayer insulating layer ILD1, the second semiconductor layer 130, a third gate insulating layer GI3, a third conductive layer 140, a second interlayer insulating layer ILD2, a fourth conductive layer 150, a first via layer VIA1, a fifth conductive layer 160, a second via layer VIA2, an anode electrode ANO and a pixel defining layer PDL may be sequentially disposed in the display area DA of the display panel 10. Each of the layers described above may consist of a single layer, or a stack of multiple layers. Another layer may be further disposed between the respective layers.

The first substrate SUB1 supports the respective layers disposed thereon. The first substrate SUB1 may be made of an insulating material such as polymer resin. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The first substrate SUB1 may include a metal material.

The first substrate SUB1 may be a flexible substrate which can be bent, folded or rolled. An example of the material of the flexible substrate may be polyimide (PI), but is not limited thereto.

A transparent substrate may be used when the organic light emitting display device is a bottom emission type or a double-sided emission type. When the organic light emitting display device is a top emission type, in addition to a transparent substrate, a translucent or opaque substrate may be applied.

The first barrier layer BA1 may be disposed on the first substrate SUB1. The first barrier layer BA1 may prevent diffusion of impurity ions, prevent permeation of moisture or external air, and perform a surface planarization function. The first barrier layer BA1 may include silicon nitride, silicon oxide, silicon oxynitride, or the like. The first barrier layer BA1 may be omitted depending on the type of the first substrate SUB1, process conditions, and the like.

The second substrate SUB2 may be disposed on the first barrier layer BA1 and may have substantially the same configuration as the first substrate SUB1. Accordingly, detailed descriptions thereof are omitted hereinafter.

The lower conductive layer BML is disposed on the second substrate SUB2. The lower conductive layer BML may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The lower conductive layer BML may include the first lower conductive pattern BML1 and the second lower conductive pattern BML2. The first lower conductive pattern BML1 and the second lower conductive pattern BML2 may be disposed to overlap the first transistor T1 in a plan view. In other words, the first lower conductive pattern BML1 and the second lower conductive pattern BML2 may be disposed to overlap at least one of a first source/drain region 101a, a second source/drain region 101b and a channel region 101c of the first transistor T1 in a plan view.

Each of the first lower conductive pattern BML1 and the second lower conductive pattern BML2 may overlap at least one of the first source/drain region 101a, the second source/drain region 101b and the channel region 101c of the first transistor T1 in a plan view. The first lower conductive pattern BML1 may overlap the channel region 101c of the first transistor T1 and may overlap the first source/drain region 101a of the first transistor T1. The second lower conductive pattern BML2 may overlap the channel region 101c of the first transistor T1 and may overlap the second source/drain region 101b of the first transistor T1. The first lower conductive pattern BML1 and the second lower conductive pattern BML2 may be physically separated and spaced apart from each other. The first lower conductive pattern BML1 and the second lower conductive pattern BML2 may be electrically insulated.

Hereinafter, a planar arrangement of the first lower conductive pattern BML1 and the second lower conductive pattern BML2 will be described with further reference to FIG. 6.

Figure 6:
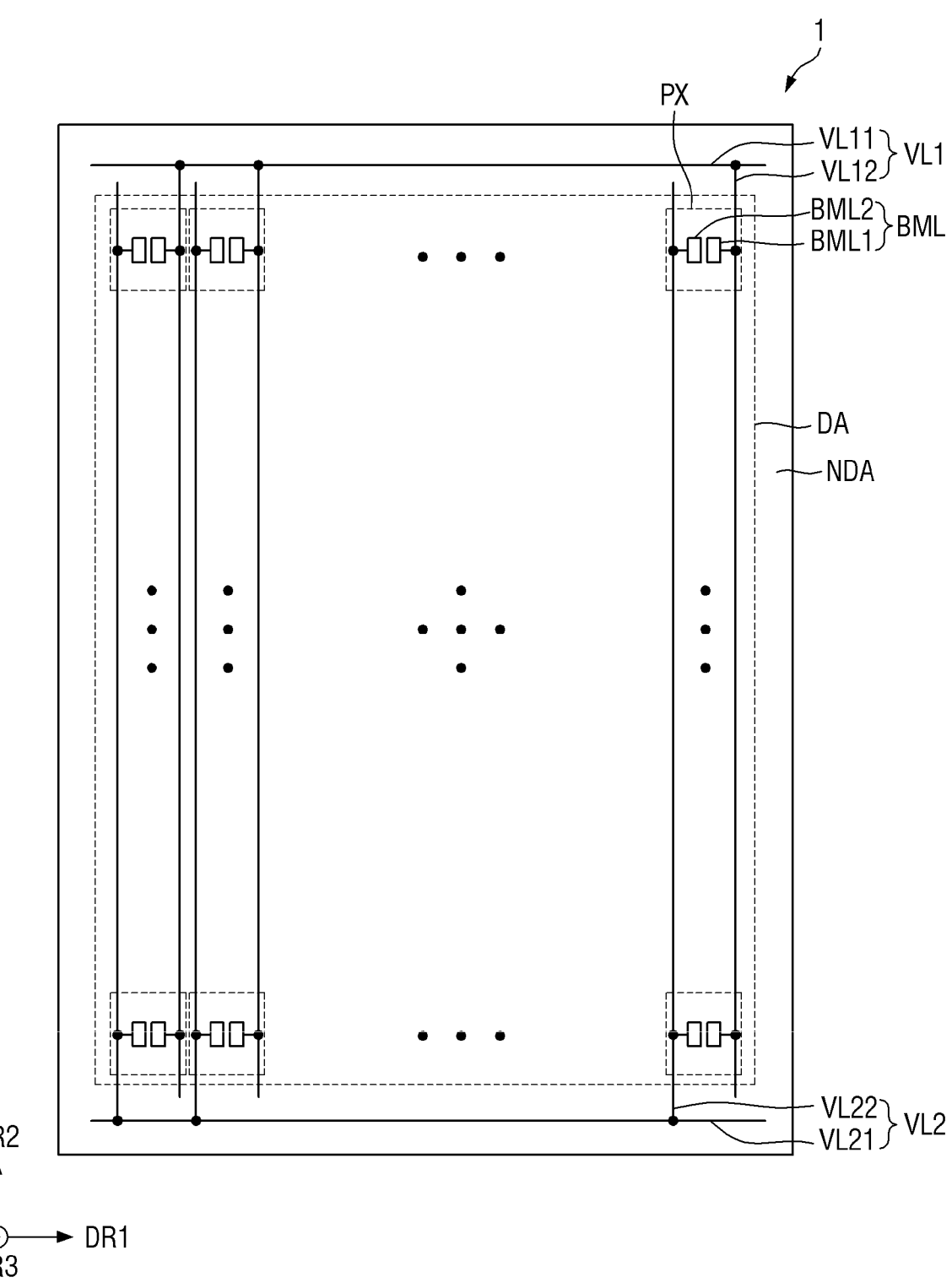
FIG. 6 is a schematic layout view of a first lower conductive pattern and a second lower conductive pattern of the display device according to one embodiment.

FIG. 6 is a schematic layout view of a first lower conductive pattern and a second lower conductive pattern of the display device according to one embodiment.

Referring to FIGS. 4 to 6, the pixel PX disposed in the display area DA may be provided in plural number, and the plurality of pixels PX may be disposed in a matrix configuration along a row direction (the first direction DR1) and a column direction)the second direction DR2). Each of the plurality of pixels PX may include the first lower conductive pattern BML1 and the second lower conductive pattern BML2. The first voltage line VL1 may be electrically connected to the plurality of first lower conductive patterns BML1 and the second voltage line VL2 may be electrically connected to the plurality of second lower conductive patterns BML2.

The first voltage line VL1 may include a first horizontal part VL11 extending in the first direction DR1 and first vertical parts VL12 extending in the second direction DR2 from the first horizontal part VL11. The first voltage line VL1 may include a mesh structure, but is not limited thereto.

The first horizontal part VL11 may be disposed in the non-display area NDA and disposed on one side (upper side in a plan view) of the second direction DR2 of the display area DA, but is not limited thereto. The first vertical parts VL12 may extend in the column direction (the second direction DR2) and be repetitively arranged along the row direction (the first direction DR1). Each of the first vertical parts VL12 may be disposed across the plurality of pixels PX in a respective column. In other words, each of the first vertical parts VL12 may extend in column direction (the second direction DR2) and may be disposed over the plurality of pixels PX arranged in the same column disposed along the second direction DR2. Accordingly, each of the first vertical parts VL12 may be electrically connected to each of the first lower conductive patterns BML1 disposed in the plurality of pixels PX arranged in the same column disposed along the second direction DR2.

However, the present disclosure is not limited thereto. The first vertical part VL12 of the first voltage line VL1 may be disposed in the non-display area NDA and disposed on one side or the other side of the first direction DR1 of the display area DA, and the first horizontal part VL11 thereof may extend in row direction (the first direction DR1) from the first vertical part VL12. In this case, the first horizontal part VL11 may be provided in plural number and each of the first horizontal parts VL11 may be disposed over the pixels PX arranged in the same row disposed along the first direction DR1. In this case, the first lower conductive pattern BML1 of each of the pixels PX in the same column may be electrically connected to the first horizontal part VL11.

The second voltage line VL2 may include a second horizontal part VL21 extending in the first direction DR1 and a second vertical part VL22 extending in the second direction DR2 from the second horizontal part VL21. The second voltage line VL2 may include a mesh structure, but is not limited thereto.

The second horizontal part VL21 may be disposed in the non-display area NDA and disposed on the other side (lower side in a plan view) of the second direction DR2 of the display area DA, but is not limited thereto. The second horizontal part VL22 may extend in the second direction DR2 and be repetitively arranged along the first direction DR1. Each of the second vertical parts VL22 may be disposed across the plurality of pixels PX disposed in the same column. In other words, each of the second vertical parts VL22 may extend in the second direction DR2 and may be disposed over the plurality of pixels PX arranged in the same column disposed along the second direction DR2. Accordingly, each of the second vertical parts VL22 may be electrically connected to each of the second lower conductive patterns BML2 disposed in the plurality of pixels PX arranged in the same column along the second direction DR2.

However, the present disclosure is not limited thereto. The second vertical part VL22 of the second voltage line VL2 may be disposed in the non-display area NDA and disposed on one side or the other side of the first direction DR1 of the display area DA, and the second horizontal part VL21 thereof may extend in the row direction (the first direction DR1) from the second vertical part VL22. In this case, the second horizontal part VL21 may be provided in plural number and each of the second horizontal parts VL21 may be disposed over the pixels PX arranged in the same row disposed along the first direction DR1. In this case, the second lower conductive pattern BML2 of each of the pixels PX may be electrically connected to the second horizontal part VL21.

Different voltages may be applied to the first voltage line VL1 and the second voltage line VL2. The voltage applied to the second voltage line VL2 may be greater than the voltage applied to the first voltage line VL1, and the difference in magnitude of voltages applied to the first voltage line VL1 and the second voltage line VL2 respectively may be 1V or more. In other words, a first voltage may be applied to the first voltage line VL1 and a second voltage may be applied to the second voltage line VL2. In this case, the second voltage may be greater than the first voltage and the second voltage may be greater than the first voltage by 1V or more.

Accordingly, different voltages may be applied to the first lower conductive pattern BML1 and the second lower conductive pattern BML2. The voltage applied to the second lower conductive pattern BML2 may be greater than the voltage applied to the first lower conductive pattern BML1, and the difference in magnitude of voltages applied to the first lower conductive pattern BML1 and the second lower conductive pattern BML2 respectively may be 1V or more. In other words, the first voltage may be applied to the first lower conductive pattern BML1 and the second voltage may be applied to the second lower conductive pattern BML2. The second voltage may be greater than the first voltage and, in this case, the second voltage may be greater than the first voltage by 1V or more.

Although the present disclosure is not limited to the following case, for example, the first power voltage ELVDD may be applied to the second voltage line VL2 and the second initialization voltage AVINT may be applied to the first voltage line VL1. In this case, the second voltage line VL2 itself may be the first power voltage line applying the first power voltage ELVDD, or may be electrically connected to the first power voltage line. In addition, the first voltage line VL1 itself may be the second initialization voltage line applying the second initialization voltage AVINT, or may be electrically connected to the second initialization voltage line.

The first lower conductive pattern BML1 and the second lower conductive pattern BML2 may not be disposed over the entire pixels PX and may be disposed only in a part of the pixels PX. In other words, the first lower conductive pattern BML1 and the second lower conductive pattern BML2 may be disposed only in the sensor area SSA and the pixel PX disposed around the sensor area SSA, or may be disposed only in the fingerprint sensing area FSA and the pixel PX disposed around the fingerprint sensing area FSA.

Figure 7:
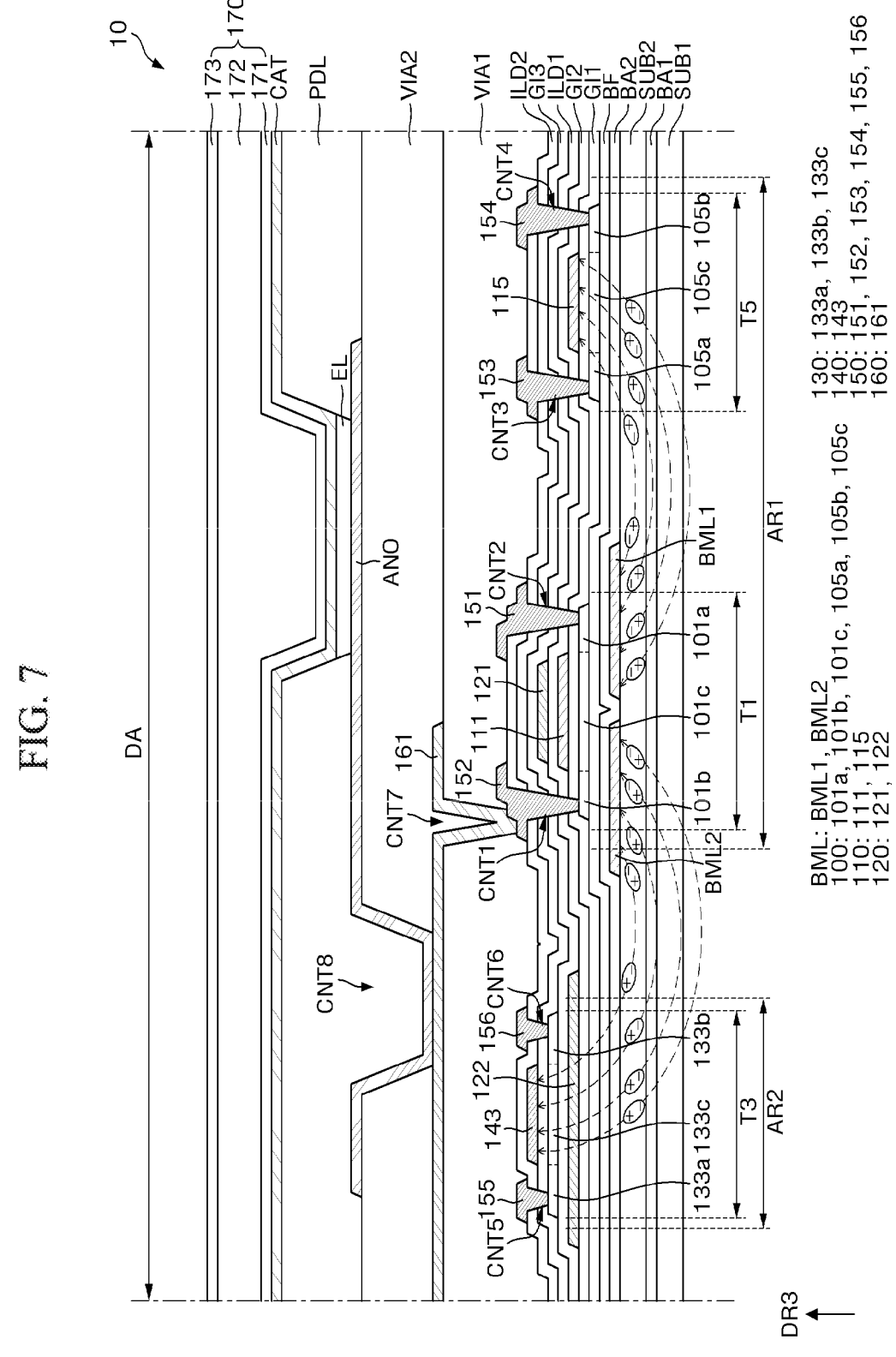
FIG. 7 is a cross-sectional view schematically illustrating a case where a polarization phenomenon occurs in the second substrate.

FIG. 7 is a cross-sectional view schematically illustrating a case where a polarization phenomenon occurs in the second substrate.

Referring to FIG. 7, electrons (−) and holes (+) may be generated in at least a partial area of the second substrate SUB2. In other words, electrons (−) and holes (+) may be generated in the second substrate SUB2 by light incident from the outside of the display panel 10 or light reflected from the inside of the display device 1 or the display panel 10. For example, in the fingerprint sensing area FSA (see FIG. 3) or the sensor area SSA (see FIG. 3) in which the lower cover layer 60 (see FIG. 3) exposes the display panel 10, external light may enter and the light incident from the outside may reach the second substrate SUB2. Alternatively, the light emitted from a light emitting layer EL may be reflected from the inside to reach the second substrate SUB2.

When the electrons (−) and holes (+) are generated in the second substrate SUB2, the characteristics of the first transistor T1 may change.

Specifically, while the organic light emitting diode OLED (see FIG. 3) emit light in each pixel PX (see FIG. 3), the third transistor T3 maintains an off state, and the fifth transistor T5 maintains an on state. As the third transistor T3 is an NMOS transistor, a negative voltage is applied to a gate electrode 143 of the third transistor T3 in the off state. In addition, as the fifth transistor T5 is a PMOS transistor, a negative voltage is applied to a gate electrode 115 of the fifth transistor T5 in the on state. In other words, a polarization phenomenon may occur below the first transistor T1.

However, as the first lower conductive pattern BML1 and the second lower conductive pattern BML2 is disposed below the first transistor T1, it is possible to suppress or prevent the first transistor T1 from being influenced by the polarization phenomenon occurring below the first transistor T1. In other words, even if the polarization phenomenon occurs below the first transistor T1, as the first lower conductive pattern BML1 and the second lower conductive pattern BML2 are disposed below the first transistor T1, it is possible to suppress or prevent electrons from being charged in the back-channel of the channel region $101c$ of the first transistor T1. Furthermore, it is possible to suppress or prevent a change in the driving range of the first transistor T1 that may occur as electrons are charged in the back-channel, to suppress or prevent a change in luminance, and to suppress or prevent defects such as stains.

In addition, as different voltages are applied to the first lower conductive pattern BML1 and the second lower conductive pattern BML2, hysteresis may be improved while improving step efficiency.

Figure 8:
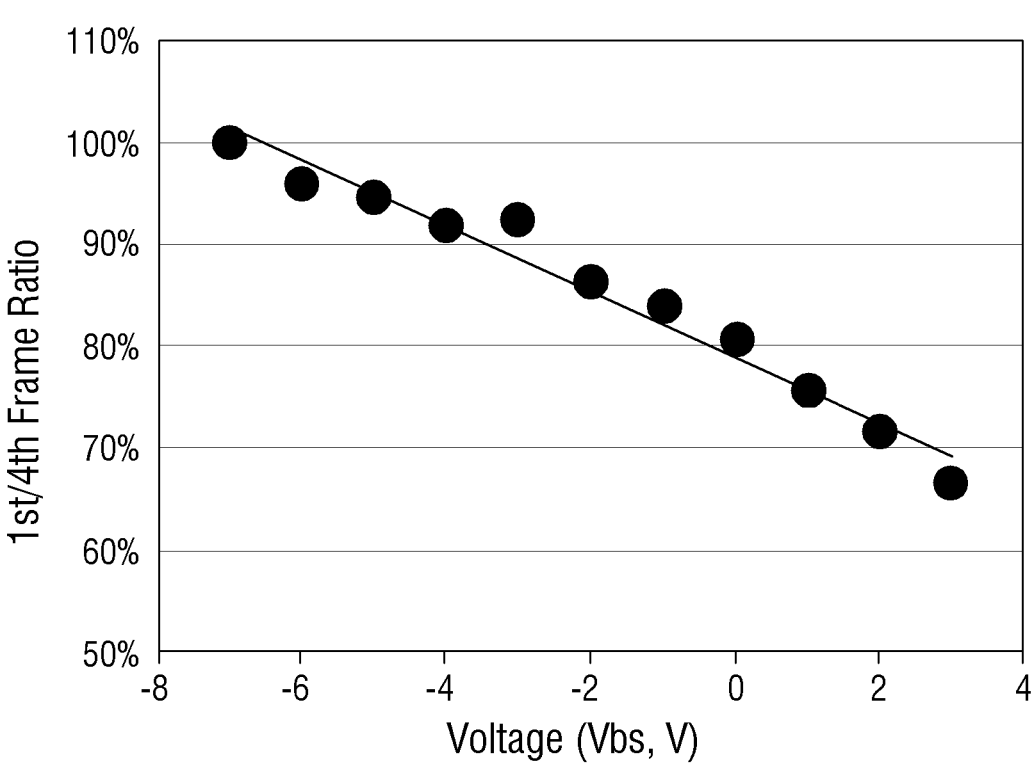
FIG. 8 is a graph illustrating step efficiency according to the magnitude of the voltage applied to the first lower conductive pattern.

FIG. 8 is a graph illustrating step efficiency according to the magnitude of the voltage applied to the first lower conductive pattern BML1.

In FIG. 8, a horizontal axis (X-axis) illustrates the magnitude of a backgate-source voltage Vbs of the first transistor T1 (see FIG. 5) and a vertical axis (Y-axis) illustrates a ratio of the luminance of a first frame to the luminance of a fourth frame. Here, the magnitude of the backgate-source voltage Vbs of the first transistor T1 (see FIG. 5) is a voltage difference between the first lower conductive pattern BML1 and a first source/drain region $101a$ (see FIG. 5) of the first transistor T1 (see FIG. 5). For example, the magnitude of the backgate-source voltage Vbs of the first transistor T1 may be $V_{EML1}$-$V_{101a}$.

Referring to FIG. 8, the ratio of the luminance of the first frame to the luminance of the fourth frame increases as the magnitude of the backgate-source voltage Vbs of the first transistor T1 (see FIG. 5) decreases.

For example, when the magnitude of the backgate-source voltage Vbs of the first transistor T1 (see FIG. 5) is 3.0V, the ratio of the luminance of the first frame to the luminance of the fourth frame is approximately 67.3%. When the magnitude of the backgate-source voltage Vbs of the first transistor T1 (see FIG. 5) is 0V, the ratio of the luminance of the first frame to the luminance of the fourth frame is approximately 82.0%. When the magnitude of the backgate-source voltage Vbs of the first transistor T1 (see FIG. 5) is −3V, the ratio of the luminance of the first frame to the luminance of the fourth frame is approximately 94.8%. When the magnitude of the backgate-source voltage Vbs of the first transistor T1 (see FIG. 5) is −7V, the ratio of the luminance of the first frame to the luminance of the fourth frame is approximately 100.5%. In this example, when the magnitude of the first power voltage ELVDD is +4.6V, the magnitude of the voltage applied to the first lower conductive pattern BML1 may be +7.6V, +4.6V, +1.6V and −2.4V, respectively, but is not limited thereto.

Accordingly, the magnitude of the backgate-source voltage Vbs of the first transistor T1 (see FIG. 5) decreases as the voltage applied to the first lower conductive pattern BML1 decreases, and the ratio of the luminance of the first frame to the luminance of the fourth frame increases as the magnitude of the backgate-source voltage Vbs of the first transistor T1 (see FIG. 5) decreases. In other words, step efficiency is improved as the magnitude of the backgate-source voltage Vbs of the first transistor T1 (see FIG. 5) decreases, thereby reducing the magnitude of the voltage applied to the first lower conductive pattern BML1 and improving the step efficiency.

Figure 9:
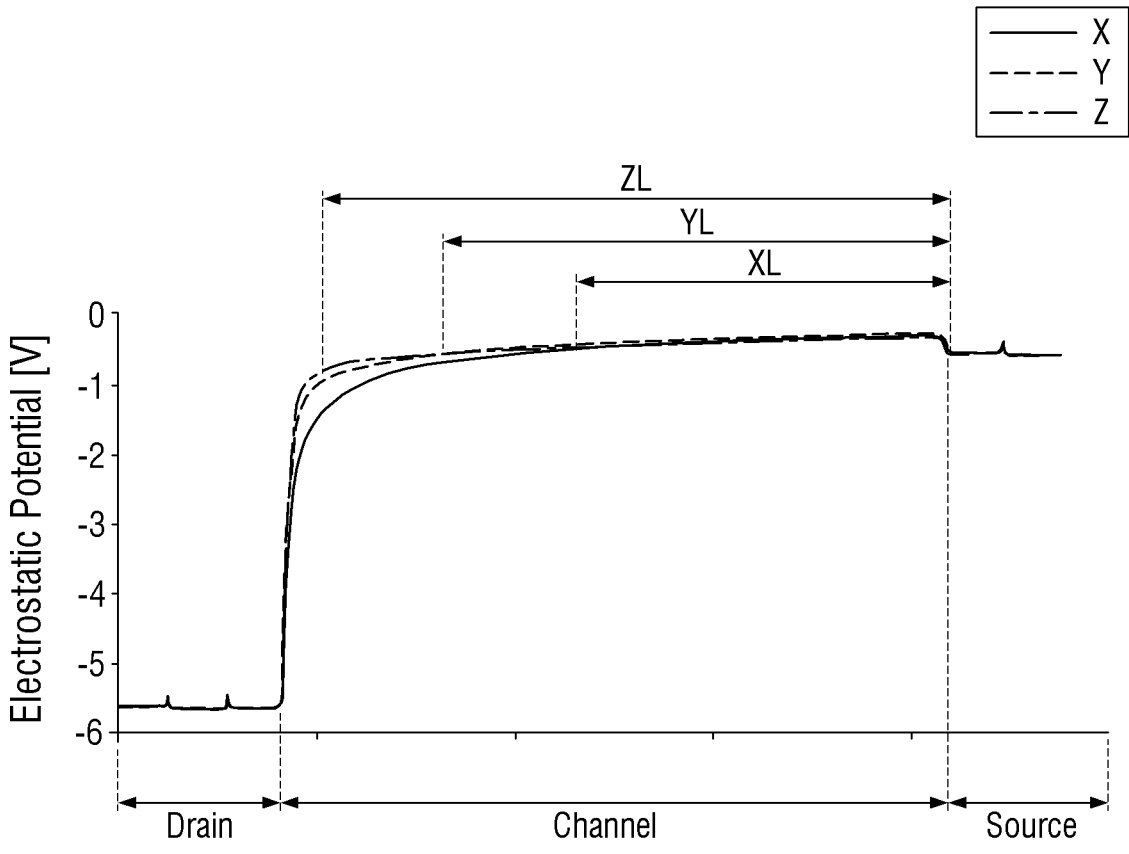
FIG. 9 is a graph illustrating electrostatic potential of each of a source region, a channel region and a drain region of a first transistor.

FIG. 9 is a graph illustrating electrostatic potential of each of a source region, a channel region and a drain region of a first transistor.

In FIG. 9, a horizontal axis represents the source region, the channel region and the drain region of the first transistor T1, and a vertical axis represents electrostatic potential of each region. In FIG. 9, the source region of the first transistor T1 refers to the first source/drain region 101a (see FIG. 5) and the drain region of the first transistor T1 refers to the second source/drain region 101b (see FIG. 5). In the graph, line X indicates a case where the first lower conductive pattern BML1 and the second lower conductive pattern BML2 are not disposed below the first transistor T1, line Y indicates a case where a voltage of 0V is applied to the second lower conductive pattern BML2, and line Z indicates a case where a voltage of 4.6V is applied to the second lower conductive pattern BML2.

Referring to FIG. 9, a hysteresis characteristic may be improved as the voltage applied to the second lower conductive pattern BML2 increases. More specifically, the channel region of the first transistor T1 has a first effective length XL in the case of line X, the channel region of the first transistor T1 has a second effective length YL in the case of line Y and the channel region of the first transistor T1 has a third effective length ZL in the case of line Z. The third effective length ZL is longer than the second effective length YL and the second effective length YL is longer than the first effective length XL. That is, as the voltage applied to the second lower conductive pattern BML2 increases, the effective length of the channel region of the first transistor T1 may increase.

As the effective length of the channel region of the first transistor T1 increases, the magnitude of a parasitic capacitance due to a gate electrode 111 of the first transistor T1 may increase. As the magnitude of the parasitic capacitance due to the gate electrode 111 of the first transistor T1 increases, the amount of change of a threshold voltage may decrease. As the threshold voltage decreases, the hysteresis characteristic may be improved. That is, as the voltage applied to the second lower conductive pattern BML2 increases, the hysteresis characteristic may be improved.

By separating and disposing the first lower conductive pattern BML1 and the second lower conductive pattern BML2 below the first transistor T1, different voltages may be applied to each of the first lower conductive pattern BML1 and the second lower conductive pattern BML2 and may be controlled separately. Accordingly, by decreasing the magnitude of the voltage applied to the first lower conductive pattern BML1, the magnitude of the voltage applied to the second lower conductive pattern BML2 may increase while improving step efficiency, thereby improving the hysteresis characteristic.

Referring to FIGS. 4 and 5, the second barrier layer BA2 may be disposed on the lower conductive layer BML. The second barrier layer BA2 may cover the lower conductive layer BML and may be disposed over the entire area of the second substrate SUB2. The second barrier layer BA2 may substantially be the same configuration as the first barrier layer BA1. Accordingly, detailed descriptions thereof are omitted hereinafter.

The buffer layer BF may be disposed on the second barrier layer BA2. The buffer layer BF may include at least one of silicon nitride, silicon oxide, or silicon oxynitride. The buffer layer BF may be omitted depending on the type of the first substrate SUB1, process conditions, or the like.

The first semiconductor layer 100 may be disposed on the buffer layer BF. The first semiconductor layer 100 may be disposed in the silicon transistor region AR1. The first semiconductor layer 100 may include a semiconductor layer (or active layer) of each of the first transistor T1, the second transistor T2, the fifth transistor T5, the sixth transistor T6, and the seventh transistor T7 and may form channels of the corresponding transistors. In other words, the first semiconductor layer 100 may include the channel region, the first source/drain region and the second source/drain region of each of the first transistor T1, the second transistor T2, the fifth transistor T5, the sixth transistor T6, and the seventh transistor T7.

The first semiconductor layer 100 may include a non-oxide semiconductor. For example, the first semiconductor layer 100 may be made of polycrystalline silicon, monocrystalline silicon, amorphous silicon, or the like. In the case where the first semiconductor 100 is made of polycrystalline silicon, the polycrystalline silicon may be formed by crystallizing amorphous silicon using a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The first conductor layer 100 may include the channel region 101c of the first transistor T1 disposed to overlap the gate electrode 111 of the first transistor T1 disposed thereabove in the thickness direction, and the first source/drain region 101a of the first transistor T1 and the second source/drain region 101b of the first transistor T1 located respectively on one side and the other side of the channel region 101c of the first transistor T1. In addition, the first semiconductor layer 100 may include a channel region 105c of the fifth transistor T5 disposed to overlap a gate electrode 115 of the fifth transistor T5 disposed thereabove in the thickness direction, and a first source/drain region 105a of the fifth transistor T5 and a second source/drain region 105b of the fifth transistor T5 located respectively on one side and the other side of the channel region 105c of the fifth transistor T5.

The first source/drain region 101a and the second source/drain region 101b of the first transistor T1 may include a plurality of carrier ions, thereby having higher conductivity and lower electrical resistance than the channel region 101c of the first transistor T1. In addition, the first source/drain region 105a and the second source/drain region 105b of the fifth transistor T5 may include a plurality of carrier ions, thereby having higher conductivity and lower electrical resistance than the channel region 105c of the fifth transistor T5.

The first gate insulating layer GI1 may be disposed on the first semiconductor layer 100. The first gate insulating layer GI1 may not only cover the top surface of the first semiconductor layer 100 except the portions where contact holes CNT1, CNT2, CNT3 and CNT4 are formed, but may also cover the side surface of the first semiconductor layer 100. The first gate insulation layer GI1 may be disposed to mostly cover the whole surface of the first substrate SUB1.

The first gate insulating layer GI1 may include a silicon compound, a metal oxide, or the like. For example, the first gate insulating layer GI1 may include silicon oxide, silicon nitride, silicon oxynitride, aluminum oxide, tantalum oxide, hafnium oxide, zirconium oxide, titanium oxide, or the like. These may be used alone or in combination with each other.

The first conductive layer 110 is disposed on the first gate insulating layer GI1. The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The first conductive layer 110 may be a gate conductive layer and may include the gate electrode of the transistor disposed in the silicon transistor region AR1. For example, the first conductive layer 110 may include the gate electrode 111 of the first transistor T1 and the gate electrode 115 of the fifth transistor T5. The gate electrode 111 of the first transistor T1 and the gate electrode 115 of the fifth transistor T5 may be gate electrodes of silicon transistors. The gate electrode 111 of the first transistor T1 may be connected to the first electrode of the storage capacitor Cst.

The first electrode of the storage capacitor Cst may be formed of the gate electrode 111 of the first transistor T1 itself or may be formed of a portion extending from the gate electrode 111 of the first transistor T1. For example, a part of the integrated pattern of the first conductive layer may overlap the first semiconductor layer 100 and function as the gate electrode 111 of the first transistor T1 at the corresponding region, and another part may not overlap the first semiconductor layer 100 and function as the first electrode of the storage capacitor Cst overlapping the second electrode 121 of the storage capacitor Cst thereon.

The second gate insulating layer GI2 may be disposed on the first conductive layer 110. The second gate insulating layer GI2 may not only cover the top surfaces of the gate electrode 115 of the fifth transistor T5 and the gate electrode 111 of the first transistor T1 except the portions where the contact holes CNT1, CNT2, CNT3 and CNT4 are formed, but may also cover the side surfaces of the gate electrode 115 of the fifth transistor T5 and the gate electrode 111 of the first transistor T1. The second gate insulation layer GI2 may be disposed mostly over the whole surface of the first gate insulation layer GI1.

The second gate insulating layer GI2 may include a silicon compound, a metal oxide, or the like. For example, the second gate insulating layer GI2 may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 120 is disposed on the second gate insulating layer GI2. The second conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second conductive layer 120 may be a capacitor conductive layer and may include a second electrode 121 of the storage capacitor Cst disposed in the silicon transistor region AR1 and a lower light blocking pattern 122 disposed in the oxide transistor region AR2. The second electrode 121 of the storage capacitor Cst may face the first electrode of the storage capacitor Cst connected to the gate electrode 111 of the first transistor T1 disposed thereunder with the second gate insulating layer GI2 interposed therebetween to form the storage capacitor Cst.

The lower light blocking pattern 122 may serve to prevent light incident from below the display panel 10 from entering the second semiconductor layer 130 located thereabove. The lower light blocking pattern 122 may overlap at least a channel region 133c of the third transistor T3 and may cover at least the channel region 133c of the third transistor T3. However, the present disclosure is not limited thereto, and the lower light blocking pattern 122 may overlap the entire area of the second semiconductor layer 130.

In some embodiments, the lower light blocking pattern 122 may be used as another gate electrode of the oxide transistor. In this case, the lower light blocking pattern 122 may be electrically connected to the gate electrode 143 of the third transistor T3, or one of a first source/drain electrode 155 and a second source/drain electrode 156 of the third transistor T3 disposed in the oxide transistor region AR2.

The first interlayer insulating layer ILD1 is disposed on the second conductive layer 120. The first interlayer insulating layer ILD1 may include a silicon compound, a metal oxide, or the like. For example, the first interlayer insulating layer ILD1 may include silicon oxide, silicon nitride, silicon oxynitride, aluminum oxide, tantalum oxide, hafnium oxide, zirconium oxide, titanium oxide, or the like. These may be used alone or in combination with each other.

The second semiconductor layer 130 is disposed on the first interlayer insulating layer ILD1. The second semiconductor layer 130 may include a semiconductor layer (or active layer) of each of the third transistor T3 and the fourth transistor T4 and may form channels of the corresponding transistors. In other words, the second semiconductor layer 130 may include the channel region, the first source/drain region and the second source/drain region of each of the third transistor T3 and the fourth transistor T4.

The second semiconductor layer 130 may include the channel region 133c of the third transistor T3 disposed to overlap the gate electrode 143 of the third transistor T3 disposed thereabove in the thickness direction, and a first source/drain region 133a of the third transistor T3 and a second source/drain region 133b of the third transistor T3 located respectively on one side and the other side of the channel region 133c of the third transistor T3. The first and second source/drain regions 133a and 133b of the third transistor T3 may be treated to have higher conductivity and lower electrical resistance than the channel region 133c.

The third gate insulating layer GI3 may be disposed on the second semiconductor layer 130. The third gate insulating layer GI3 may include a silicon compound, a metal oxide, or the like. For example, the third gate insulating layer GI3 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 140 is disposed on the third gate insulation layer GI3. The third conductive layer 140 may be a gate conductive layer and may include a gate electrode of the transistor disposed on the oxide transistor region AR2. For example, the third conductive layer 140 may include the gate electrode 143 of the third transistor T3. The gate electrode 143 of the third transistor T3 may be a gate electrode of the oxide transistor.

The third conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second interlayer insulating layer ILD2 is disposed on the third conductive layer 140. The second interlayer insulating layer ILD2 may include a silicon compound, a metal oxide, or the like. For example, the second interlayer insulating layer ILD2 may include silicon oxide, silicon nitride, silicon oxynitride, aluminum oxide, tantalum oxide, hafnium oxide, zirconium oxide, titanium oxide, or the like. These may be used alone or in combination with each other.

The fourth conductive layer 150 is disposed on the second interlayer insulating layer ILD2. The fourth conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The fourth conductive layer 150 may be a data conductive later and may include the first source/drain electrode and the second source/drain electrode of the transistors disposed on the silicon transistor region AR1 and the first source/drain electrode and the second source/drain electrode of the transistors disposed in the oxide transistor region AR2. For example, the fourth conductive layer 150 may include the first source/drain electrode 151 and the second source/drain electrode 152 of the first transistor T1 and a first source/drain electrode 153 and a second source/drain electrode 154 of the third transistor T3 disposed in the silicon transistor region AR1 and may also include the first source/drain electrode 155 and the second source/drain electrode 156 of the third transistor T3 disposed in the oxide transistor region AR2.

In the transistor disposed in the silicon transistor region AR1, the first source/drain electrode 151 of the first transistor T1 may be formed through the second interlayer insulating layer ILD2, the third gate insulating layer GI3, the first interlayer insulating layer ILD1, the second gate insulating layer GI2, and the first gate insulating layer GI1 to be connected to the first source/drain region 101a of the first transistor T1 of the first semiconductor layer 100 through the contact hole CNT1 exposing the first source/drain region 101a of the first transistor T1. The second source/drain electrode 152 of the first transistor T1 may be formed through the second interlayer insulating layer ILD2, the third gate insulating layer GI3, the first interlayer insulating layer ILD1, the second gate insulating layer GI2 and the first gate insulating layer GI1 to be connected to the second source/drain region 101b of the first transistor T1 of the first semiconductor layer 100 through the contact hole CNT2 exposing the second source/drain region 101b of the first transistor T1 of the first semiconductor layer 100.

In the transistor disposed in the silicon transistor region AR1, the first source/drain electrode 153 of the fifth transistor T5 may be formed through the second interlayer insulating layer ILD2, the third gate insulating layer GI3, the first interlayer insulating layer ILD1, the second gate insulating layer GI2 and the first gate insulating layer GI1 to be connected to the first source/drain region 105a of the fifth transistor T5 through the contact hole CNT3 exposing the first source/drain region 105a of the fifth transistor T5. The second source/drain electrode 154 of the fifth transistor T5 may be formed through the second interlayer insulating layer ILD2, the third gate insulating layer GI3, the first interlayer insulating layer ILD1, the second gate insulating layer GI2, and the first gate insulating layer GI1 to be connected to the second source/drain region 105b of the fifth transistor T5 through the contact hole CNT4 exposing the second source/drain region 105b of the fifth transistor T5.

In the transistor disposed in the oxide transistor region AR2, the first source/drain electrode 155 of the third transistor T3 may be formed through the second interlayer insulating layer ILD2 and the third gate insulating layer GI3 to be connected to the first source/drain region 133a of the third transistor T3 through a contact hole CNT5 exposing the first source/drain region 133a of the third transistor T3. The second source/drain electrode 156 of the third transistor T3 may be formed through the second interlayer insulating layer ILD2 and the third gate insulating layer GI3 to be connected to the second source/drain region 133b of the third transistor T3 through a contact hole CNT6 exposing the second source/drain region 133b of the third transistor T3.

The first via layer VIA1 is disposed on the fourth conductive layer 150. The first via layer VIA1 may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The first via layer VIA1 may be disposed on top of the second interlayer layer ILD2 to completely cover the top surface of the second interlayer insulation layer ILD2. In the case where the first via layer VIA1 is formed as an organic layer, the top surface thereof may be flat in spite of the steps of the lower part thereof.

The fifth conductive layer 160 is disposed on the first via layer VIAL The fifth conductive layer 160 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The fifth conductive layer 160 may include an anode connection electrode 161. A seventh contact hole CNT7 exposing the second source/drain electrode 152 of the first transistor T1 disposed in the silicon transistor region AR1 is disposed in the first via layer VIA1, and the anode connection electrode 161 may be connected to the second source/drain electrode 152 of the first transistor T1 through the seventh contact hole CNT7. Although the anode connection electrode 161 is directly connected to the second source/drain electrode 152 of the first transistor T1 in the drawings, the sixth transistor T6 is further disposed between the anode connection electrode 161 and the second source/drain electrode 152 of the first transistor T1.

The second via layer VIA2 is disposed on the fifth conductive layer 160. The second via layer VIA2 may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The anode electrode ANO is disposed on the second via layer VIA2. The anode electrode ANO may be a pixel electrode disposed separately for each pixel. The anode electrode ANO may be formed through the second via layer VIA2 and be electrically connected to the anode connection electrode 161 through an eighth contact hole CNT8 exposing a part of the anode connection electrode 161.

The anode electrode ANO may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EL. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL may include an opening partially exposing the anode electrode ANO. The pixel defining layer PDL may be formed of an organic insulating material or an inorganic insulating material. For example, the pixel defining layer PDL may include at least one of polyimide resin, acrylic resin, a silicon compound, or polyacrylic resin.

The light emitting layer EL is disposed on the anode electrode ANO exposed by the pixel defining layer PDL. The light emitting layer EL may include an organic material layer. The organic material layer of the light emitting layer may include an organic light emitting layer, and may further include a hole injection/transport layer and/or an electron injection/transport layer.

The cathode electrode CAT may be disposed on the light emitting layer EL. The cathode electrode CAT may be a common electrode extended across all the pixels PX. The anode electrode ANO, the light emitting layer EL, and the cathode electrode CAT may constitute an organic light emitting element.

The cathode electrode CAT may include a material layer having a low work function, such as Li, Ca, LiF/Ca, LiF/Al, Al, Mg, Ag, Pt, Pd, Ni, Au Nd, Jr, Cr, BaF, Ba or a compound or mixture thereof (e.g., a mixture of Ag and Mg). The cathode electrode CAT may further include a transparent metal oxide layer disposed on the material layer having a low work function.

The anode electrode ANO, the light emitting layer EL, and the cathode electrode CAT may constitute an organic light emitting element.

A thin film encapsulation layer 170 including a first encapsulation film 171, a second encapsulation film 172 and a third encapsulation film 173 is disposed on the cathode electrode CAT. In the end portion of the thin film encapsulation layer 170, the first encapsulation film 171 and the third encapsulation film 173 may be in contact with each other.

The second encapsulation film 172 may be sealed by the first encapsulation film 171 and the third encapsulation film 173. Each of the first encapsulation film 171 and the third encapsulation film 173 may include an inorganic insulating material, and the second encapsulation film 172 may include an organic insulating material.

Hereinafter, other embodiments will be described. In the following embodiments, a description of the same components as those of the above-described embodiment will be omitted or simplified, and differences will be mainly described.

Figure 10:
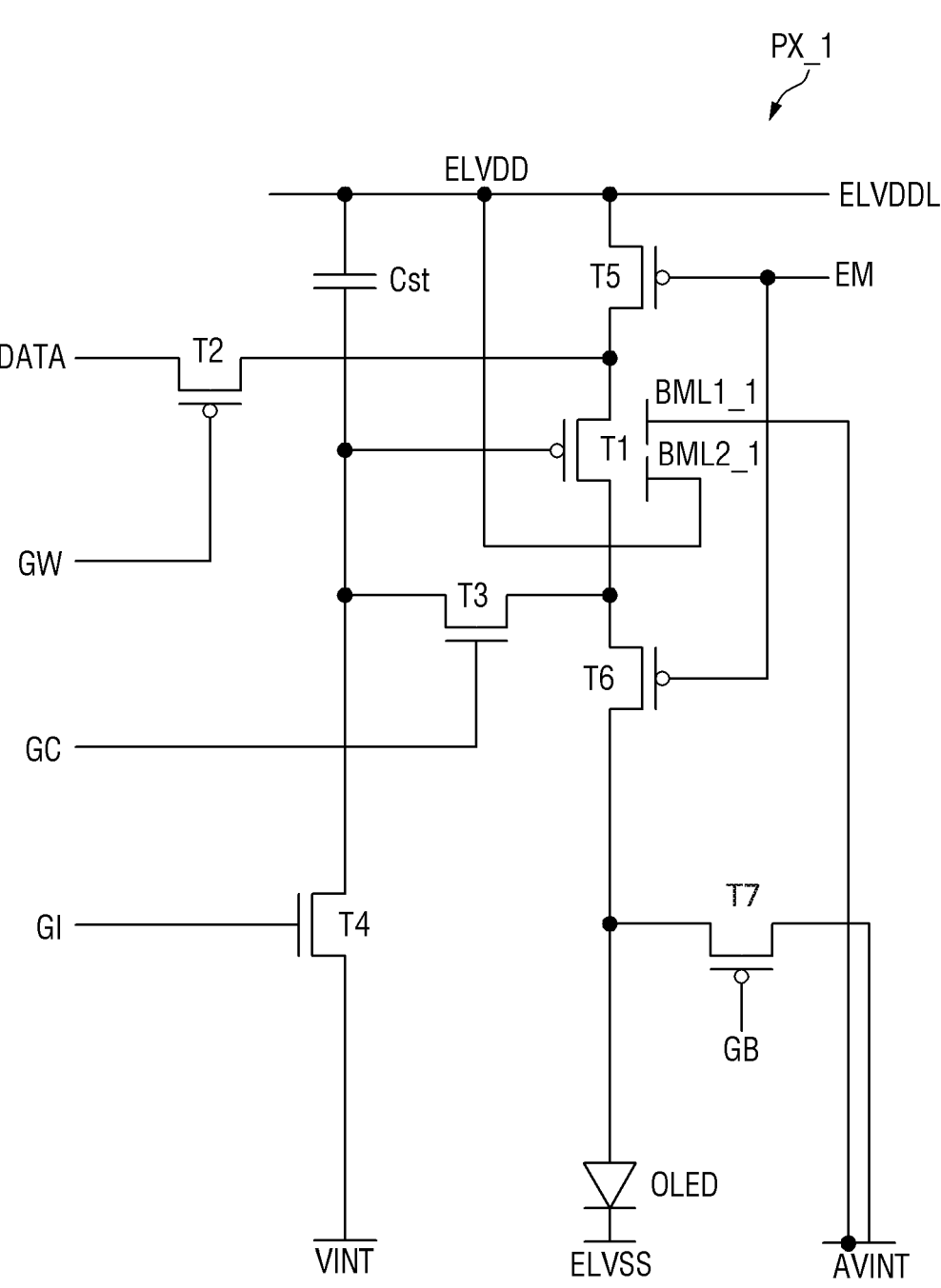
FIG. 10 is an equivalent circuit diagram of one pixel of a display device according to another embodiment.

FIG. 10 is an equivalent circuit diagram of one pixel of a display device according to another embodiment.

Referring to FIG. 10, the present embodiment is different from the embodiment of FIG. 4 in that a first lower conductive pattern BML1_1 of a pixel PX_1 is electrically connected to a second initialization voltage line to which the second initialization voltage AVINT is applied and a second lower conductive pattern BML2_1 is electrically connected to a first power voltage line to which the first power voltage ELVDD is applied. The first lower conductive pattern BML1_1 may be electrically connected to the second initialization voltage line in each of the plurality of pixels PX, and the second lower conductive pattern BML2_1 may be electrically connected to the first power voltage line in each of the plurality of pixels PX, but the present disclosure is not limited thereto. In this case, the magnitude of the first power voltage ELVDD may be greater than the second initialization voltage AVINT.

Also in this case, by disposing the first lower conductive pattern BML1_1 and the second lower conductive pattern BML2_1, defects such as stains can be suppressed or prevented even if a polarization phenomenon occurs. Further, by applying different voltages to the first lower conductive pattern BML1_1 and the second lower conductive pattern BML2_1, the hysteresis characteristic may be improved while improving step efficiency. In addition, a separate wire for applying a voltage to the first lower conductive pattern BML1_1 and the second lower conductive pattern BML2_1 is not necessary, thereby reducing the process cost while improving the process efficiency.

Figure 11:
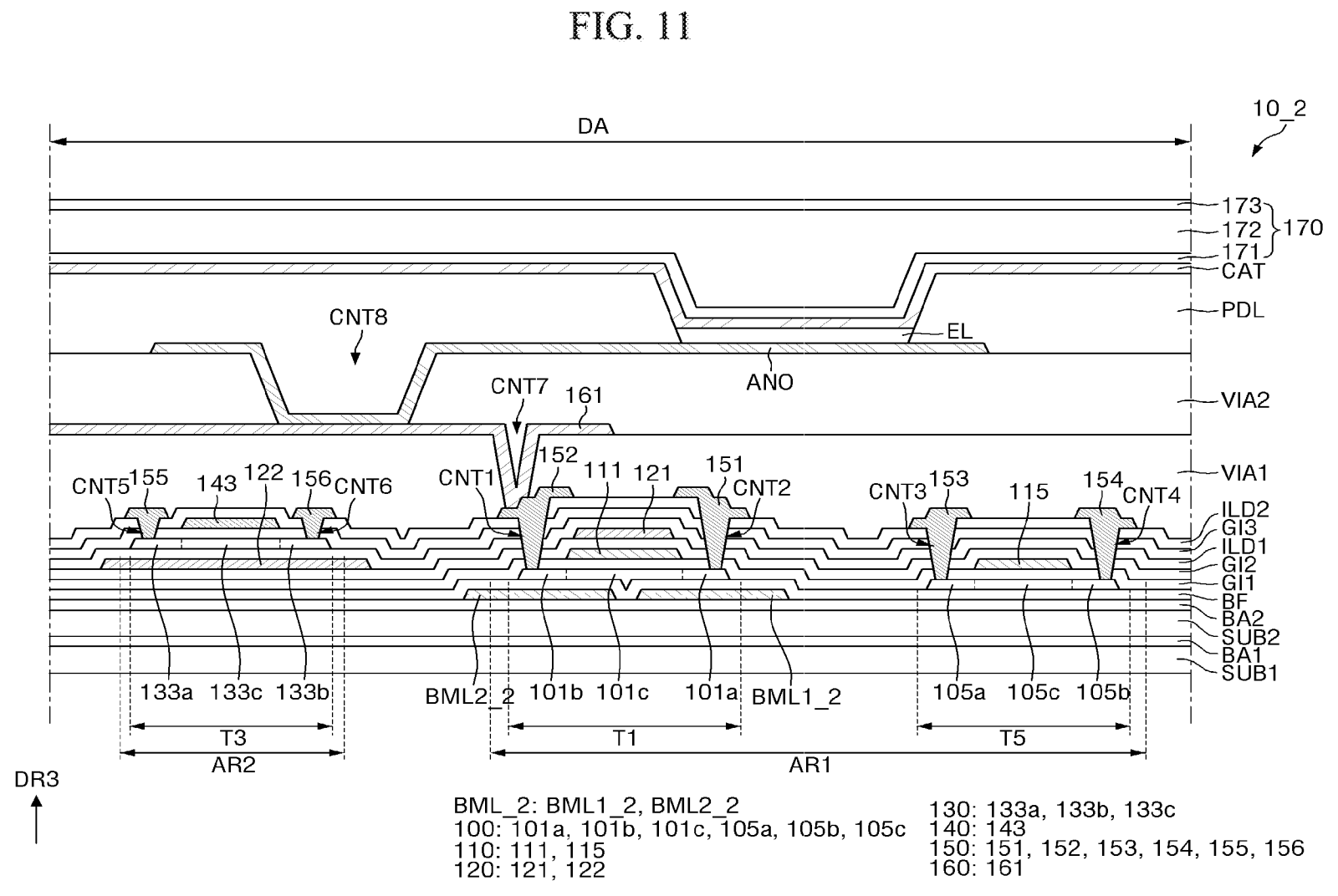

FIG. 11 is a cross-sectional view of a display panel according to still another embodiment.

Referring to FIG. 11, the present embodiment is different from the embodiment of FIG. 5 in that a lower conductive layer BML_2 of a display panel 10_2 is disposed between the second barrier layer BA2 and the buffer layer BF. That is, a first lower conductive pattern BML1_2 and a second lower conductive pattern BML2_2 of the lower conductive layer BML_2 may be disposed between the second barrier layer BA2 and the buffer layer BF. However, the present disclosure is not limited thereto, and one of the first lower conductive pattern BML1_2 and the second lower conductive pattern BML2_2 may be disposed between the second substrate SUB2 and the second barrier layer BA2 and the other thereof may be disposed between the second barrier layer BA2 and the buffer layer BF.

Also in this case, by disposing the first lower conductive pattern BML1_2 and the second lower conductive pattern BML2_2, defects such as stains can be suppressed or prevented even if a polarization phenomenon occurs. Further, by applying different voltages to the first lower conductive pattern BML1_2 and the second lower conductive pattern BML2_2, the hysteresis characteristic may be improved while improving step efficiency. In addition, as the first lower conductive pattern BML1_2 and the second lower conductive pattern BML2_2 is disposed closer to the channel region 101*c* of the first transistor T1, the first lower conductive pattern BML1_2 and the second lower conductive pattern BML2_2 may more efficiently function.

Figure 12:
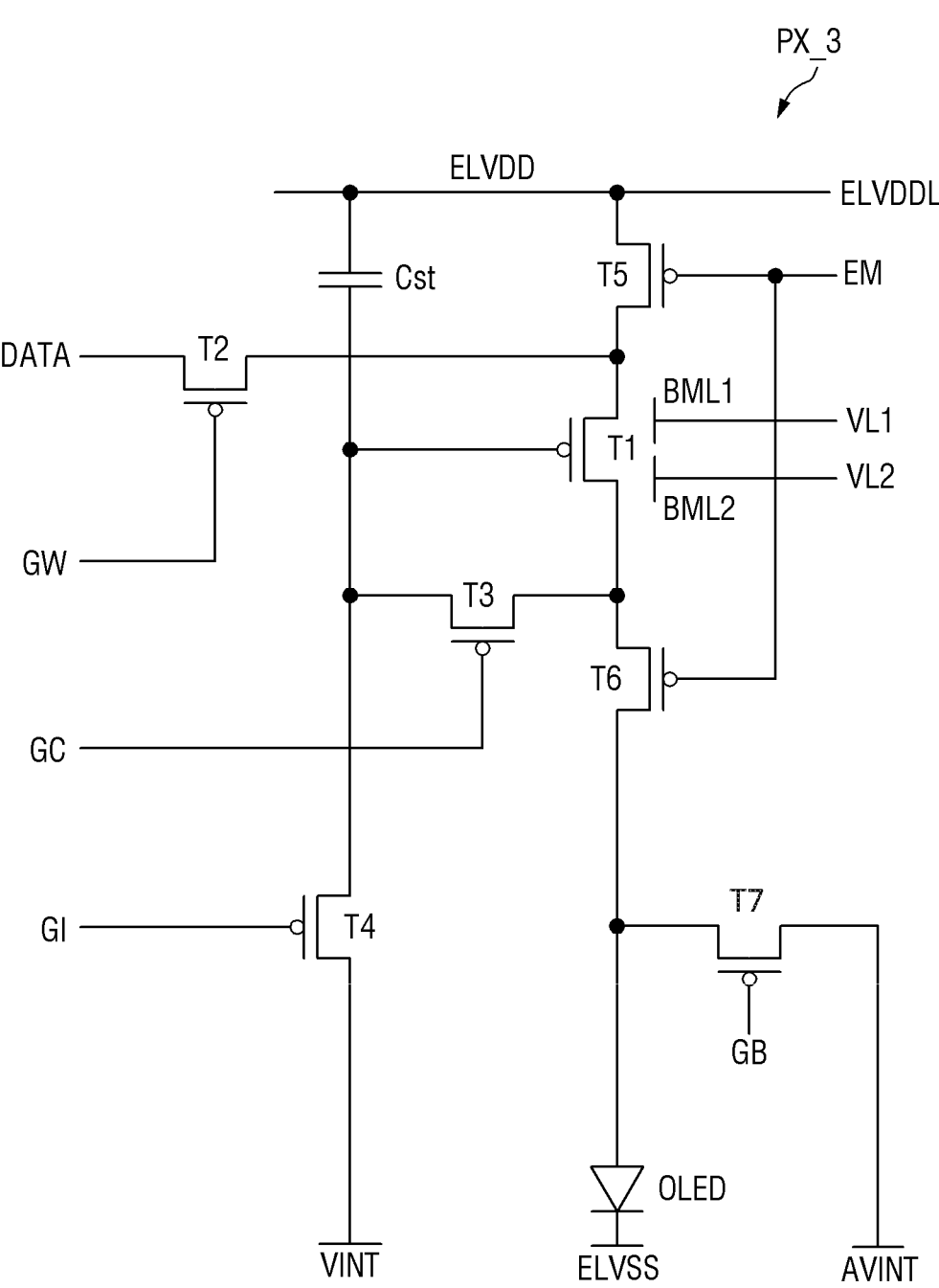
FIG. 12 is an equivalent circuit diagram of one pixel of a display device according to still another embodiment.

FIG. 12 is an equivalent circuit diagram of one pixel of a display device according to still another embodiment. FIG. 13 is a cross-sectional view illustrating a cross section of a one pixel according to still another embodiment.

Referring to FIGS. 12 and 13, the present embodiment is different from the embodiment of FIGS. 4 and 5 in that an active layer of each of a third transistor T3 and a fourth transistor T4 of a pixel PX_3 is formed of a first semiconductor layer 100_3.

More specifically, the first semiconductor layer 100_3 according to the present embodiment may further include a first source/drain region 133*a*_3, a second source/drain region 133*b*_3 and a channel region 133*c*_3 of the third transistor T3. Although not illustrated, the first semiconductor layer 100_3 may further include a first source/drain region, a second source/drain region and a channel region of the fourth transistor T4. The second semiconductor layer 130 (see FIG. 5) may be omitted. The third transistor T3 and the fourth transistor T4 may be disposed in a silicon transistor region AR1_3.

A gate electrode 143_3 of the third transistor T3 may be formed of a first conductive layer 110_3. The third semiconductor layer 140 (see FIG. 5) may be omitted. The fourth conductive layer 150 may be in contact with the first semiconductor layer 100_3 through contact holes CNT1 to CNT6, and the contact holes CNT1 to CNT6 may be formed through the first gate insulating layer GI1, the second gate insulating layer GI2, and the first interlayer insulating layer ILD1 to expose the first semiconductor layer 100_3.

The first to seventh transistors T1 to T7 may all be PMOS transistors.

Also in this case, by disposing the first lower conductive pattern BML1 and the second lower conductive pattern BML2, defects such as stains can be suppressed or prevented even if a polarization phenomenon occurs. Further, by applying different voltages to the first lower conductive pattern BML1 and the second lower conductive pattern BML2, the hysteresis characteristic may be improved while improving step efficiency. In addition, the active layer of each of the first to seventh transistors T1 to T7 may be formed of the first semiconductor layer 100_3 and may constitute the pixel PX_3 having various structures as needed.

In concluding the detailed description, those skilled in the art will appreciate that many variations and modifications can be made to the preferred embodiments without substantially departing from the principles of the present disclosure. Therefore, the disclosed preferred embodiments of the inventive concept are used in a generic and descriptive sense only and not for purposes of limitation.

What is claimed is:

1. A display device comprising:
a substrate;
a lower conductive layer disposed on the substrate and including a first lower conductive pattern and a second lower conductive pattern electrically isolated from each other;
a buffer layer disposed on the lower conductive layer;
a first transistor disposed on the buffer layer and electrically connected to a light emitting element, the first transistor including:
a first semiconductor layer disposed on the buffer layer, and including a first channel region, a first source region disposed on one side of the first channel region, and a first drain region disposed on the other side of the first channel region;
a second transistor, the second transistor including:
a second semiconductor layer disposed on the first semiconductor layer and including a second channel region, a second source region disposed on one side of the second channel region, and a second drain region disposed on the other side of the second channel region;
a first insulating layer disposed on the first semiconductor layer;
a first gate electrode disposed on the first insulating layer;
a third transistor comprising a first electrode connected to an initialization voltage line and a second electrode connected to an electrode of the light emitting element; and
a fourth transistor comprising a first electrode connected to a first power voltage line and a second electrode connected to the first source region of the first transistor,
wherein the first lower conductive pattern is overlapped with the first channel region of the first transistor and the first source region of the first transistor, and the second lower conductive pattern is overlapped with the region of the first transistor and the first drain region of the first transistor in plan view,
wherein a first voltage is applied to the first lower conductive pattern which is overlapped with the first channel region of the first transistor and the first source region of the first transistor in plan view, and a second voltage greater than the first voltage is applied to the second lower conductive pattern which is overlapped with the first channel region of the first transistor and the first drain region of the first transistor in plan view,
wherein the second semiconductor layer does not overlap the first lower conductive pattern and the second lower conductive pattern in plan view,
wherein each of the first lower conductive pattern, the second lower conductive pattern, and the first transistor overlapped with the first lower conductive pattern and the second lower conductive pattern is positioned in a display area which displays an image, and
wherein the first lower conductive pattern is connected to the initialization voltage line, and the second lower conductive pattern is connected to the first power voltage line.

2. The display device of claim 1, further comprising:
a second insulating layer disposed on the first gate electrode of the first transistor;
a third insulating layer disposed on the second semiconductor layer; and
a second gate electrode disposed on the third insulating layer,
wherein the second semiconductor layer includes a material different from that of the first semiconductor layer.

3. The display device of claim 2, wherein the first semiconductor layer includes a non-oxide semiconductor and the second semiconductor layer includes an oxide semiconductor.

4. The display device of claim 3, wherein the first transistor is a PMOS transistor and the second transistor is an NMOS transistor.

5. The display device of claim 2, further comprising a light emitting element electrically connected to the first drain region of the first transistor.

6. The display device of claim 5, wherein the first transistor controls a driving current flowing from the first source region of the first transistor to the first drain region of the first transistor in response to a voltage applied to the first gate electrode of the first transistor.

7. The display device of claim 2, further comprising a third transistor, wherein a third channel region of the third transistor includes the first semiconductor layer.

8. The display device of claim 1, wherein a voltage applied to the first lower conductive pattern is an initialization voltage and a voltage applied to the second lower conductive pattern is a first power voltage.

9. The display device of claim 1, further comprising a barrier layer disposed between the lower conductive layer and the buffer layer.

10. A display device comprising:

a first power voltage line;

a light emitting element;

a first transistor including a first channel region, a first source region disposed on one side of the first channel region and electrically connected to the first power voltage line, and a first drain region disposed on the other side of the first channel region and electrically connected to the light emitting element;

a second transistor;

a lower conductive layer disposed below the first transistor, and including a first lower conductive pattern overlapped with the first channel region of the first transistor and the first source region of the first transistor, and a second lower conductive pattern overlapped with the first channel region of the first transistor and the first drain region of the driving transistor first transistor;

a third transistor comprising a first electrode connected to an initialization voltage line and a second electrode connected to an electrode of the light emitting element; and a fourth transistor comprising a first electrode connected to a first power voltage line and a second electrode connected to the first source region of the first transistor, wherein the first lower conductive pattern and the second lower conductive pattern are electrically isolated from each other, and each of the first lower conductive pattern, the second lower conductive pattern, and the first transistor overlapped with the first lower conductive pattern and the second lower conductive pattern is positioned in a display area which displays an image, wherein a first voltage is applied to the first lower conductive pattern which is overlapped with the first channel region of the first transistor and the first source region of the first transistor in plan view, and a second voltage greater than the first voltage is applied to the second lower conductive pattern which is overlapped with the first channel region of the first transistor and the first drain region of the first transistor in plan view, wherein a second semiconductor layer of the second transistor does not overlap the first lower conductive pattern and the second lower conductive pattern in plan view, and wherein the first lower conductive pattern is connected to the initialization voltage line, and the second lower conductive pattern is connected to the first power voltage line.

11. The display device of claim 10, wherein the first channel region of the first transistor includes a first semiconductor layer, and a second channel region of the second transistor includes a second semiconductor layer different from the first semiconductor layer.

12. The display device of claim 11, wherein the first semiconductor layer includes a non-oxide semiconductor and the second semiconductor layer includes an oxide semiconductor.

13. The display device of claim 12, wherein the first transistor is a PMOS transistor and the second transistor is an NMOS transistor.

14. The display device of claim 11, further comprising a third transistor, wherein a third channel region of the third transistor includes the first semiconductor layer.

15. The display device of claim 10, wherein the first transistor controls a driving current flowing from the first source region of the first transistor to the first drain region of the first transistor in response to a voltage applied to a gate electrode of the first transistor.

16. The display device of claim 10, wherein a voltage applied to the first lower conductive pattern is an initialization voltage and a voltage applied to the second lower conductive pattern is a first power voltage.

* * * * *